United States Patent
Lee et al.

(10) Patent No.: US 11,177,010 B1
(45) Date of Patent: Nov. 16, 2021

(54) BITCELL FOR DATA REDUNDANCY

(71) Applicant: QUALCOMM Incorporated, San Diego, CA (US)

(72) Inventors: Hochul Lee, Los Angeles, CA (US); Anil Chowdary Kota, San Diego, CA (US); Anne Srikanth, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/927,818

(22) Filed: Jul. 13, 2020

(51) Int. Cl.
*G11C 17/16* (2006.01)
*G11C 17/18* (2006.01)
*G11C 7/06* (2006.01)
*G11C 7/22* (2006.01)
*G11C 7/12* (2006.01)

(52) U.S. Cl.
CPC ............ *G11C 17/165* (2013.01); *G11C 7/065* (2013.01); *G11C 7/12* (2013.01); *G11C 7/22* (2013.01); *G11C 17/18* (2013.01)

(58) Field of Classification Search
CPC ......... G11C 17/165; G11C 7/065; G11C 7/22; G11C 17/18; G11C 7/12
See application file for complete search history.

(56) References Cited

U.S. PATENT DOCUMENTS

| | | |
|---|---|---|
| 4,970,686 A | 11/1990 | Naruke et al. |
| 5,497,347 A | 3/1996 | Feng |
| 5,811,863 A | 9/1998 | Rostoker et al. |
| 5,949,712 A | 9/1999 | Rao et al. |
| 6,266,269 B1 | 7/2001 | Karp et al. |
| 6,272,041 B1 | 8/2001 | Naji |
| 6,314,030 B1 | 11/2001 | Keeth |
| 6,331,943 B1 * | 12/2001 | Naji .................. G11C 11/15 257/E27.005 |
| 6,731,535 B1 | 5/2004 | Ooishi et al. |

(Continued)

FOREIGN PATENT DOCUMENTS

| | | |
|---|---|---|
| CN | 1459113 A | 11/2003 |
| JP | H0386247 A | 4/1991 |

(Continued)

OTHER PUBLICATIONS

J. Hung, X. Li, J. Wu and M. Chang, "Challenges and Trends inDeveloping Nonvolatile Memory-Enabled Computing Chips for Intelligent Edge Devices," in IEEE Transactions on Electron Devices, vol. 67, No. 4, pp. 1444-1453, Apr. 2020, doi: 10.1109/TED.2020.2976115. (Year: 2020).*

(Continued)

*Primary Examiner* — Ajay Ojha
(74) *Attorney, Agent, or Firm* — Chui-kiu Teresa Wong

(57) ABSTRACT

The present disclosure provides bit cells with data redundancy according to various aspects. In certain aspects, a bit cell includes a first memory element coupled to a write bit line, and a first write-access switch coupled between the first memory element and a ground. The bit cell also includes a second memory element coupled to the write bit line, and a second write-access switch coupled between the second memory element and the ground. The bit cell further includes a read-access switch coupled between the first memory element and a read bit line, wherein a control input of the read-access switch is coupled to a read-select line.

20 Claims, 17 Drawing Sheets

(56) References Cited

U.S. PATENT DOCUMENTS

| | | |
|---|---|---|
| 6,778,432 B2 | 8/2004 | Ohtani |
| 6,876,576 B2 * | 4/2005 | Hidaka ................ G11C 29/804 365/171 |
| 6,885,578 B2 | 4/2005 | Cha |
| 6,917,540 B2 | 7/2005 | Ooishi |
| 7,102,910 B2 | 9/2006 | Pham et al. |
| 7,206,220 B2 | 4/2007 | Ditewig et al. |
| 7,245,546 B2 | 7/2007 | Uvieghara |
| 7,254,078 B1 | 8/2007 | Park et al. |
| 7,286,437 B2 | 10/2007 | Kim et al. |
| 7,405,989 B2 | 7/2008 | Chung |
| 7,492,629 B2 | 2/2009 | Sugibayashi et al. |
| RE40,995 E * | 11/2009 | Ghodsi ................ B82Y 10/00 257/295 |
| 7,630,226 B2 | 12/2009 | Matsufuji et al. |
| 7,656,738 B2 | 2/2010 | Namekawa |
| 7,688,613 B2 | 3/2010 | Chung et al. |
| 7,710,813 B1 | 5/2010 | Im et al. |
| 7,724,600 B1 | 5/2010 | Im et al. |
| 7,817,455 B2 | 10/2010 | Fredeman et al. |
| 7,911,820 B2 | 3/2011 | Anand et al. |
| 8,116,152 B2 | 2/2012 | Kaku et al. |
| 8,134,854 B2 | 3/2012 | Huang |
| 8,194,489 B2 | 6/2012 | Bentley et al. |
| 8,331,126 B2 | 12/2012 | Terzioglu |
| 8,611,144 B2 | 12/2013 | Terzioglu |
| 8,724,418 B2 | 5/2014 | Kim et al. |
| 8,760,955 B2 * | 6/2014 | Liao ........................ G11C 17/16 365/225.7 |
| 8,803,590 B2 | 8/2014 | Luo et al. |
| 9,418,763 B2 * | 8/2016 | Huang ................ G11C 29/787 |
| 2006/0050582 A1 * | 3/2006 | Perner ..................... G11C 8/10 365/205 |
| 2006/0104136 A1 | 5/2006 | Gogl et al. |
| 2008/0002504 A1 | 1/2008 | Nakano et al. |
| 2008/0094898 A1 | 4/2008 | Nakano et al. |
| 2008/0252361 A1 | 10/2008 | Chung et al. |
| 2008/0316852 A1 | 12/2008 | Matsufuji et al. |
| 2009/0268503 A1 | 10/2009 | Schepens et al. |
| 2010/0032778 A1 | 2/2010 | Lu et al. |
| 2010/0054026 A1 | 3/2010 | Xi et al. |
| 2010/0302833 A1 | 12/2010 | Teramoto et al. |
| 2011/0317468 A1 | 12/2011 | Terzioglu |
| 2013/0039117 A1 * | 2/2013 | Lin ........................ G11C 17/18 365/96 |
| 2015/0310926 A1 | 10/2015 | Akamatsu |

FOREIGN PATENT DOCUMENTS

| | | |
|---|---|---|
| JP | H06172550 A | 6/1994 |
| JP | H08316427 A | 11/1996 |
| JP | 3086247 B2 | 9/2000 |
| JP | 2006155710 A | 6/2006 |
| JP | 2008016085 A | 1/2008 |
| JP | 2008171477 A | 7/2008 |
| JP | 2008171481 A | 7/2008 |
| RU | 2310928 C2 | 11/2007 |
| TW | 200534280 | 10/2005 |
| TW | 200731511 | 8/2007 |
| TW | 200826283 A | 6/2008 |
| WO | 2009079662 A1 | 6/2009 |

OTHER PUBLICATIONS

Robson, Norm et al.; Electrically Programmable Fuse (eFUSE): From Memory Redundancy to Autonomic Chips; IEEE 2007 Custom Intergrated Circuits Conference (CICC); Sep. 16-19, 2007, IEEE 2007, p. 799-804.

* cited by examiner

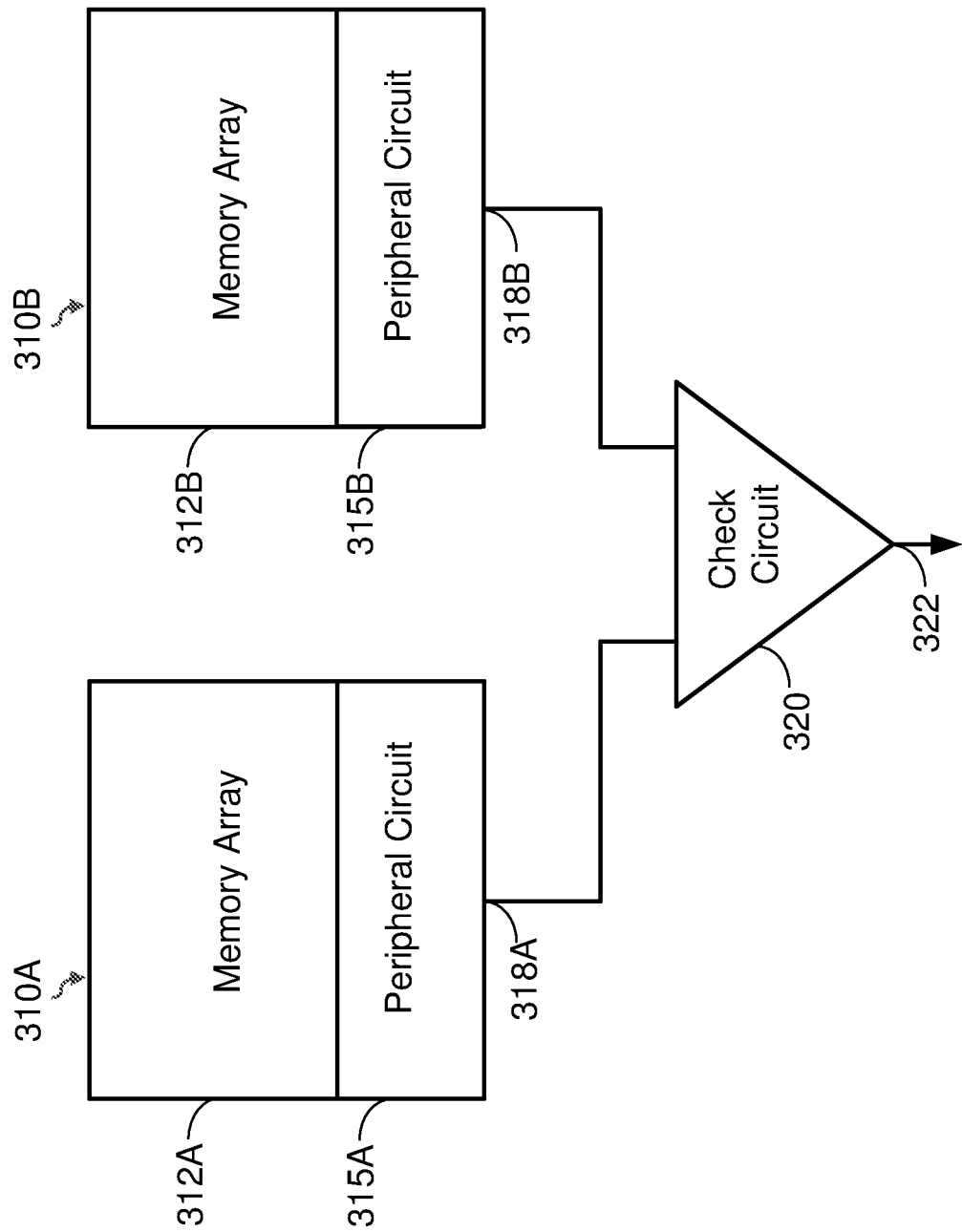

BITCELL FOR DATA REDUNDANCY

BACKGROUND

Field

Aspects of the present disclosure relate generally to memory, and more particularly, to a bit cell with data redundancy.

Background

Non-volatile memory can store data without power. A non-volatile memory device may include an array of bit cells where each bit cell stores a respective bit. Each bit cell in the array may include a respective fuse (e.g., electrical fuse (eFuse)), in which the value of the bit stored in the bit cell depends on whether the respective fuse is blown or unblown.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a bit cell. The bit cell includes a first memory element coupled to a write bit line, and a first write-access switch coupled between the first memory element and a ground. The bit cell also includes a second memory element coupled to the write bit line, and a second write-access switch coupled between the second memory element and the ground. The bit cell further includes a read-access switch coupled between the first memory element and a read bit line, wherein a control input of the read-access switch is coupled to a read-select line.

A second aspect relates to a memory device. The memory device includes a first bit cell. The first bit cell includes a first memory element coupled to a write bit line, and a first write-access switch coupled between the first memory element and a ground. The first bit cell also includes a second memory element coupled to the write bit line, and a second write-access switch coupled between the second memory element and the ground. The first bit cell further includes a first read-access switch coupled between the first memory element and a read bit line, wherein a control input of the first read-access switch is coupled to a first read-select line. The memory device also includes a sense amplifier coupled to the read bit line.

A third aspect relates to a system. The system includes a first memory device, wherein the first memory device includes a bit cell. The bit cell includes a first memory element coupled to a write bit line, and a first write-access switch coupled between the first memory element and a ground. The bit cell also includes a second memory element coupled to the write bit line, and a second write-access switch coupled between the second memory element and the ground. The bit cell further includes a read-access switch coupled between the first memory element and a read bit line, wherein a control input of the read-access switch is coupled to a read-select line. The first memory device also includes a read circuit coupled to the read bit line. The system also includes a processor coupled to the read circuit.

A fourth aspect relates to a method of operating a bit cell. The bit cell includes a first memory element coupled to a write bit line, a first write-access switch coupled between the first memory element and a ground, a second memory element coupled to the write bit line, a second write-access switch coupled between the second memory element and the ground, and a read-access switch coupled between the first memory element and a read bit line. The method includes turning on the read-access switch and the second write-access switch, turning off the first write-access switch, and sensing a series resistance of the first memory element and the second memory element via the read bit line.

BRIEF DESCRIPTION OF THE DRAWINGS

FIG. 3 shows an example in which two copies of data are stored in two separate memory devices for data redundancy according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A memory device may be used to store data such as firmware, security keys, system settings, etc. The memory device includes an array of bit cells arranged in rows and columns (referred to as a memory array), where each bit cell stores a single bit.

Figure 1:
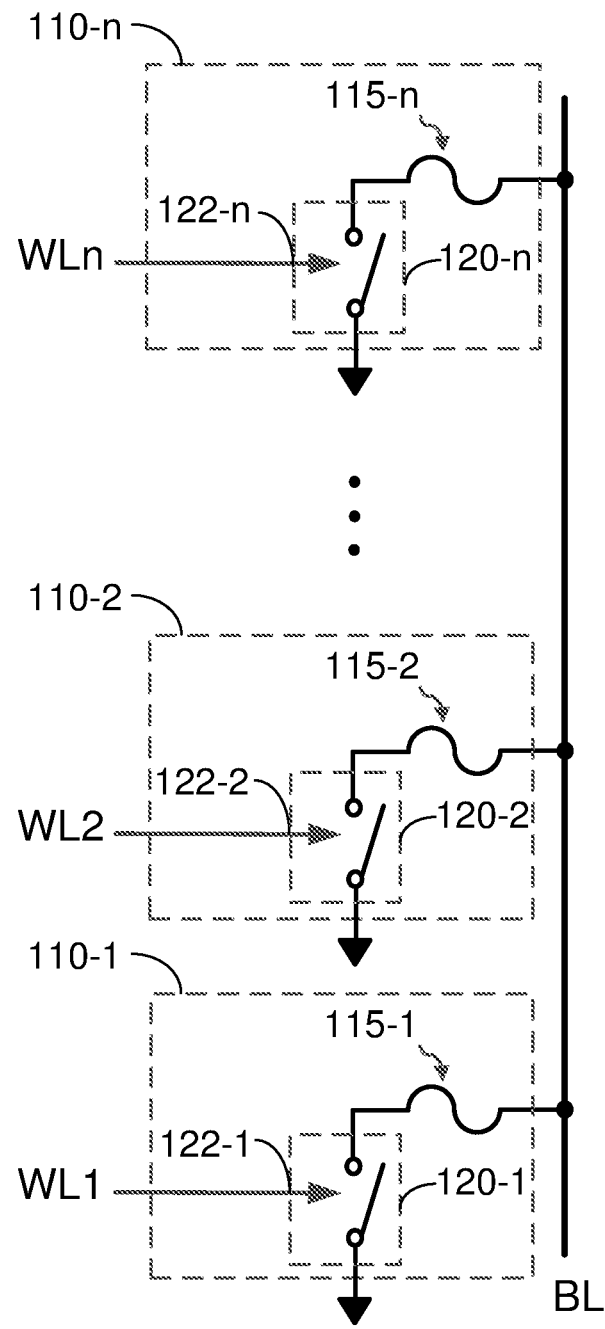
FIG. 1 shows an example of bit cells where each bit cell includes a respective fuse according to certain aspects of the present disclosure.

FIG. 1 shows an example of a column of bit cells 110-1 to 110-n in a memory array coupled to a bit line (labeled "BL"). Each of the bit cells 110-1 to 110-n is also coupled to a respective word line (labeled "WL1" to "WLn"). The word lines WL1 to WLn may be used to select one of the bit cells 110-1 to 110-n in the column at a time.

In this example, each of the bit cells 110-1 to 110-n includes a respective switch 120-1 to 120-n (e.g., a transistor) and a respective fuse 115-1 to 115-n (e.g., eFuse). In each bit cell 110-1 to 110-n, the respective fuse 115-1 to 115-n is coupled between the bit line BL and the respective switch 120-1 to 120-n, the respective switch 120-1 to 120-n is coupled between the respective fuse 115-1 to 115-n and ground, and a control input 122-1 to 122-n of the respective switch 120-1 to 120-n is coupled to the respective word line WL1 to WLn. As used herein, a "control input" of a switch controls whether a switch is turned on (i.e., closed) or turned off (i.e., open) based on a signal (e.g., a voltage) at the control input. In this example, a switch is turned on when the respective word line WL1 to WLn is selected.

The bit value stored in each bit cell 110-1 to 110-n depends on whether the respective fuse 115-1 to 115-n is blown or unblown. For example, a bit cell may store a bit value of zero if the respective fuse 115-1 to 115-n is unblown and store a bit value of one if the respective fuse 115-1 to 115-n is blown. The resistance of an unblown fuse is low (e.g., 50Ω) and the resistance of a blown fuse is high (e.g., 10 KΩ). Thus, the bit value stored in a bit cell may be read by sensing the resistance of the respective fuse, as discussed further below.

To blow the fuse of one of the bit cells 110-1 to 110-n (i.e., program the bit cell with a bit value of one), a select circuit selects the word line corresponding to the bit cell, and a write circuit sends a high current through the fuse of the bit cell via the bit line BL to blow the fuse. The high current electro-migrates metal in the fuse, causing the resistance of the fuse to significantly increase.

To read the bit stored in one of the bit cells 110-1 to 110-n, the select circuit selects the word line corresponding to the bit cell, and a read circuit senses the resistance of the respective fuse via the bit line BL. The read circuit may read a one if the resistance is high, which corresponds to a blown fuse, and the read circuit may read a zero if the resistance is low, which corresponds to an unblown fuse.

A challenge with using a fuse to store a bit is that the resistance of a blown fuse may decrease over time due to a reverse EM effect caused by temperature gradient and frequent read operations. The decrease in resistance over time causes some of the bit cells with blown fuses to be erroneously read as zeros instead of ones. The erroneous reads may be unacceptable in cases where sensitive data is stored in the memory array such as firmware, security keys and system settings.

Figure 2B:
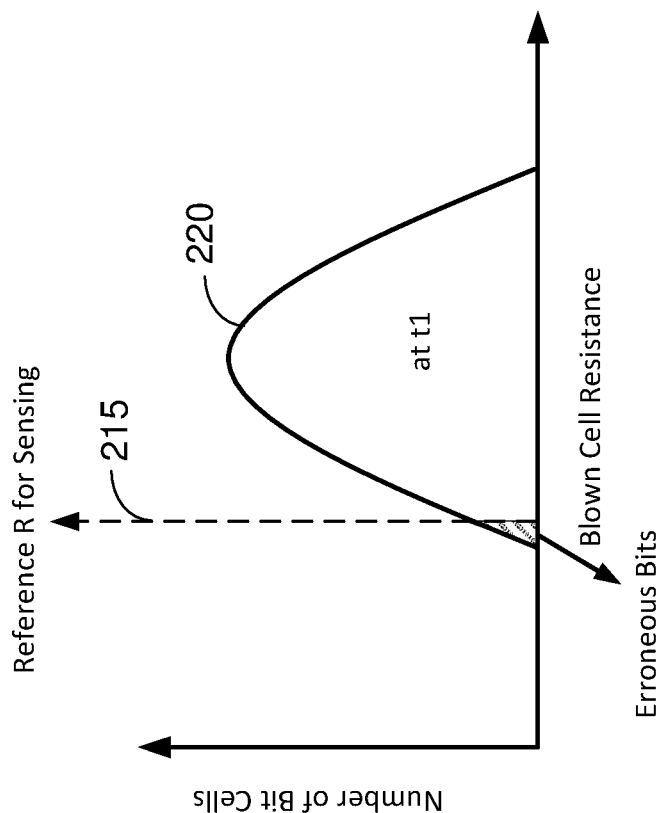
FIG. 2B shows an example of the resistance distribution for the bit cells with blown fuses after numerous read operations according to certain aspects of the present disclosure.
Figure 2A:
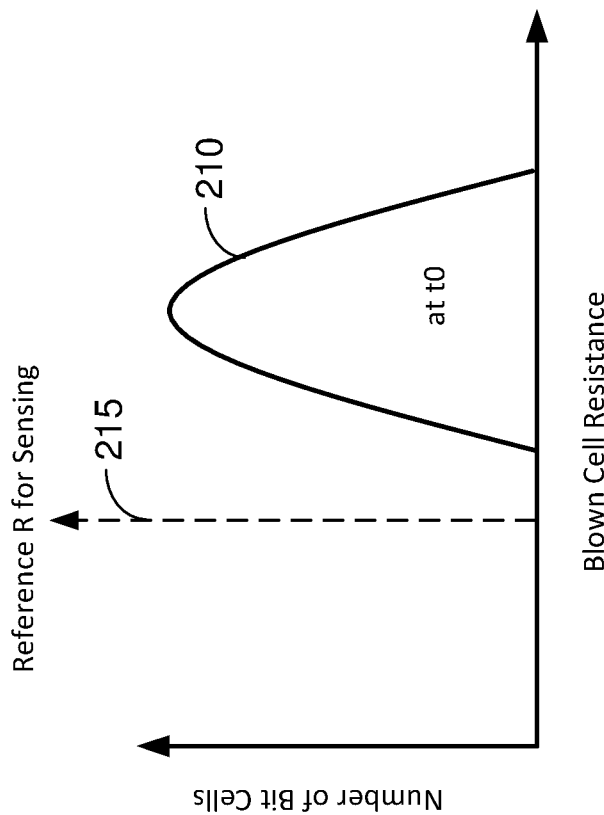
FIG. 2A shows an example of a resistance distribution for bit cells with blown fuses according to certain aspects of the present disclosure.

An example of the reverse EM effect is illustrated in FIGS. 2A and 2B. FIG. 2A shows an exemplary distribution of resistances 210 for bit cells with blown fuses at time t0, which is immediately after the fuses have been blown. FIG. 2A also shows a reference resistance 215 used in a read operation to determine whether a bit cell stores a one or zero. In this example, a sensed resistance greater than the reference resistance 215 is read as a bit value of one and a sensed resistance less than the reference resistance 215 is read as a bit value of zero. As shown in FIG. 2A, the resistance of each bit cell with a blown fuse is greater than the reference resistance 215. Thus, each bit cell with a blown fuse is correctly read as a one at time t0.

FIG. 2B shows an example of the distribution of resistances 220 for the bit cells with blown fuses at time t1, which occurs after the bit cells have been read numerous times. As shown in FIG. 2B, the resistances of some of the bit cells have decreased below the reference resistance 215 due to the reverse EM effect. As a result, these bit cells are erroneously read as zeros instead of ones.

One approach for addressing the above problem is to write two copies of data to two separate memory devices 310A and 310B, an example of which is shown in FIG. 3. Each memory device 310A and 310B includes a respective memory array 312A and 312B configured to store the data and a respective peripheral circuit 315A and 315B configured to write the data to and read the data from the respective memory array 312A and 312B. In this approach, one of the memory devices 310A and 310B serves as a redundant memory device that stores a redundant copy of the data to improve read accuracy.

During a read operation, both copies of the data are read from the memory devices 310A and 310B. For each bit of the data, the check circuit 320 checks the bit read from the memory device 310A and the bit read from the memory device 310B. If the bit read from at least one of the memory devices 310A and 310B is a one, then the check circuit 320 determines that the bit value is one regardless of whether the bit read from the other one of the memory device 310A and 310B is a one or a zero (i.e., the check circuit 320 performs a logical OR operation). Thus, if the bit read from one of the memory devices 310A and 310B is erroneously read as a zero instead of a one due to the reverse EM effect, the check circuit 320 is still able to determine the correct bit value of one as long as the bit from the other one of the memory devices 310A and 310B is correctly read. The probability that the bit read from the memory device 310A and the bit read from the memory device 310B are both erroneously read due to the reverse EM effect is much lower than the probability that the bit read from one of the memory devices 310A and 310B is erroneously read due to the reverse EM effect. Thus, this approach improves the accuracy of read operations by using a redundant memory device that stores a redundant copy of the data.

A drawback of the above approach is that the redundant memory device increases area overhead and power consumption. Accordingly, an approach for achieving data redundancy that uses less area overhead and lower power is desirable.

Aspects of the present disclosure provide bit cells with built-in data redundancy that lower area overhead and power consumption compared with the above approach, as discussed further below.

Figure 4A:
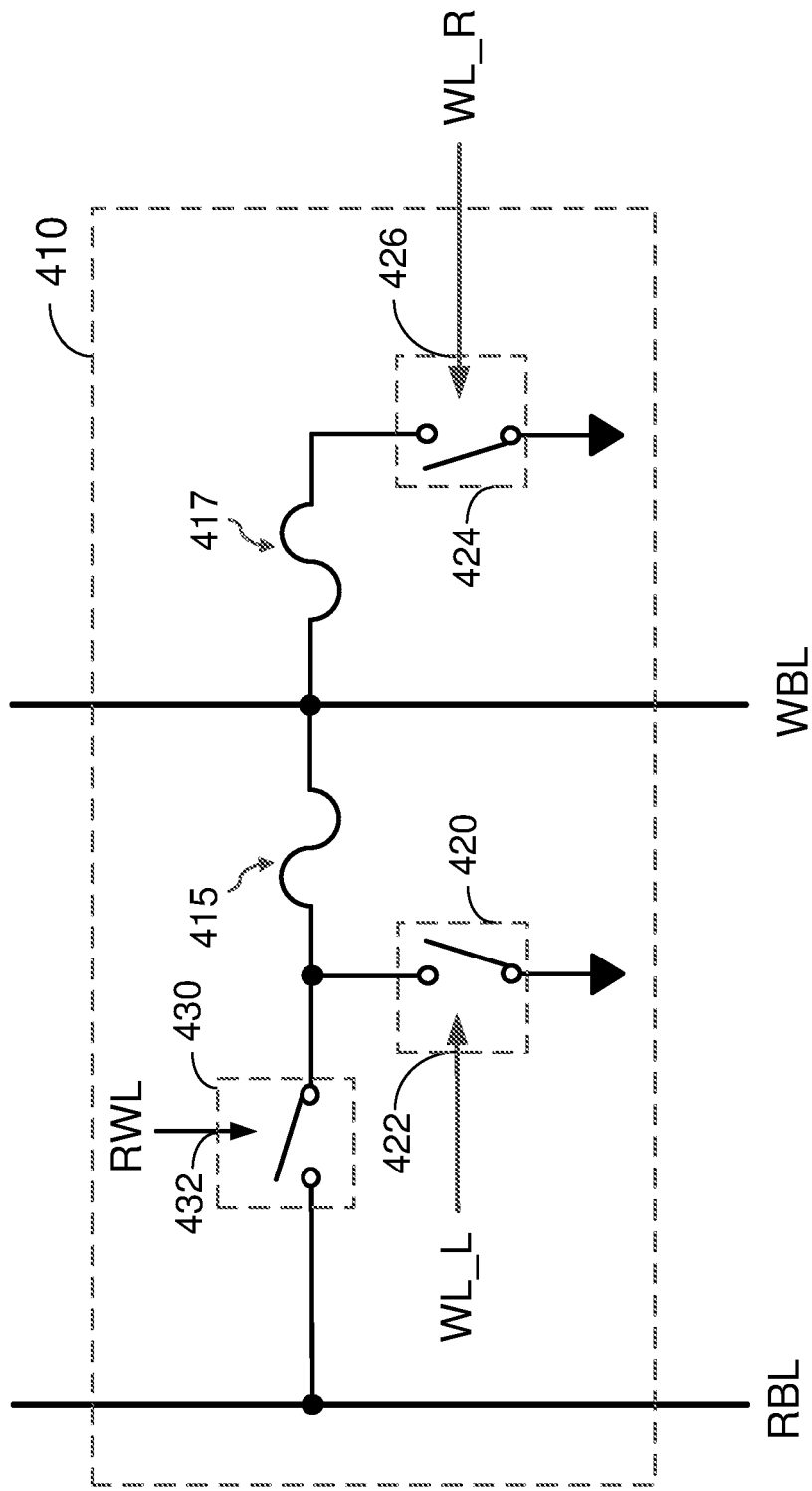
FIG. 4A shows an exemplary bit cell including two fuses for data redundancy according to certain aspects of the present disclosure.

FIG. 4A shows an exemplary bit cell 410 according to aspects of the present disclosure. The bit cell 410 includes two fuses instead of one fuse to provide data redundancy for improved read reliability. In the example in FIG. 4, the two fuses include a first fuse 415 and a second fuse 417. Each of the fuses 415 and 417 may be implemented with an electrical fuse (eFuse). The bit cell 410 also includes a first write-access switch 420, a second-write access switch 424, and a read-access switch 430.

The first fuse 415 is coupled between a write bit line (labeled "WBL") and the first write-access switch 420, and the first write-access switch 420 is coupled between the first fuse 415 and ground. The control input 422 of the first write-access switch 420 is coupled to a first write-select line (labeled "WL_L"). As shown in FIG. 4A, one end or terminal of the first fuse 415 is coupled to the write bit line WBL and the other end or terminal of the first fuse 415 is coupled to the first write-access switch 420.

The second fuse 417 is coupled between the write bit line WBL and the second write-access switch 424, and the second write-access switch 424 is coupled between the second fuse 417 and ground. The control input 426 of the second write-access switch 424 is coupled to a second write-select line (labeled WL_R"). As shown in FIG. 4A, one end or terminal of the second fuse 417 is coupled to the write bit line WBL and the other end or terminal of the second fuse 417 is coupled to the second write-access switch 424.

The read-access switch 430 is coupled between the first fuse 415 and a read bit line (labeled "RBL"). In the example in FIG. 4A, the read-access switch 430 is coupled to the same end or terminal of the first fuse 415 as the first write-access switch 420. The control input 432 of the read-access switch 430 is coupled to a read-select line (labeled "RWL").

Each of the switches 420, 424 and 430 may be implemented with a transistor, a transmission gate, or another type of switching device.

The first fuse 415 and the second fuse 417 are both initially unblown, which corresponds to a bit value of zero. Thus, to store a zero in the bit cell 410, the fuses 415 and 417 are left alone.

To write (i.e., program) a one in the bit cell 410, both fuses 415 and 417 are blown. In one example, the first fuse 415 and the second fuse 417 are blown one at a time. To blow the first fuse 415, the first write-access switch 420 is turned on with the second write-access switch 424 and the read-access switch 430 turned off. The first write-access switch 420 may be turned on by selecting the first write-select line WL_L. A write circuit (not shown) then sends a high current through the first fuse 415 via the write bit line WBL to blow the first fuse 415.

To blow the second fuse 417, the second write-access switch 424 is turned on with the first write-access switch 420 and the read-access switch 430 turned off. The second write-access switch 424 may be turned on by selecting the second write-select line WL_R. The write circuit (not shown) then sends a high current through the second fuse 417 via the write bit line WBL to blow the second fuse 417.

Thus, both fuses 415 and 417 are blown to store a bit value of one in the bit cell 410. Blowing both fuses 415 and 417 of the bit cell 410 provides data redundancy that allows the bit value of one to be correctly read even if the resistance of one of the fuses 415 and 417 decreases below the reference resistance, as discussed further below.

To read the bit value stored in the bit cell 410 after both fuses have been blown, the resistances of both fuses 415 and 417 are sensed simultaneously. During a read operation, the read-access switch 430 and the second write-access switch 424 are turned on with the first write-access switch 420 turned off. The read-access switch 430 may be turned on by selecting the read-select line RWL, and the second write-access switch 424 may be turned on by selecting the second write-select line WL_R. Also, the write bit line WBL is floating during the read operation. A read circuit (not shown in FIG. 4A) then senses the series resistance of the fuses 415 and 417 via the read bit line RBL. The series resistance of the fuses 415 and 417 is equal to the sum of the resistance of the first fuse 415 and the resistance of the second fuse 417. The read circuit reads a one if the series resistance of the fuses 415 and 417 is above the reference resistance and reads a zero if the series resistance of the fuses 415 and 417 is below the reference resistance.

Since the read circuit senses the series resistance of the fuses 415 and 417, the read circuit correctly reads a bit value of one if at least one of the fuses 415 and 417 maintains a resistance at or above the reference resistance. Thus, if the resistance of one of the fuses 415 and 417 decreases below the reference resistance due to the reverse EM effect, the read circuit is still able to correctly read the bit value if the resistance of the other one of the fuses 415 and 417 is at or above the reference resistance. The bit value is incorrectly read as a zero if the series resistance of the fuses 415 and 417 decreases below the reference resistance, which has a much lower probability of occurring than the resistance of one of the fuses 415 and 417 decreasing below the reference resistance. Thus, by using two fuses 415 and 417 for data redundancy, the bit cell 410 achieves significantly higher read accuracy than a bit cell using a single fuse.

In the above example, the bit cell 410 is programmed to store a bit value of one. If the bit cell 410 is used to store a bit value of zero, then the fuses 415 and 417 are left unblown. In this case, when the read circuit senses the series resistance of the fuses 415 and 417 during a read operation, the sensed series resistance is well below the reference resistance, and the read circuit reads a bit value of zero.

In addition to improving read accuracy with built-in data redundancy, the bit cell 410 also reduces leakage current compared with each of the bit cells 110-1 to 110-n in FIG. 1, as explained below.

In bit cell 110-1, the switch 120-1 needs to be large in order to handle a large write current that may be used to blow the respective fuse 115-1. Because of the large size of the switch 120-1, the switch 120-1 may leak a large amount of current from the bit line BL even when the switch 120-1 is turned off. The large leakage current increases power consumption and may affect the read operations of the other bit cells 110-2 to 110-n.

In contrast, in the bit cell 410 according to aspects of the present disclosure, the read-access switch 430 may be made much smaller than the write-access switches 420 to 424 to reduce leakage current on the read bit line RBL. This is because the read-access switch 430 is turned off during write operations, and therefore does not need to handle large write currents used to blow the fuses 415 to 417. Rather, the read-access switch 430 handles a much smaller current during read operations. This is because the current used to sense the series resistance of the fuses 415 and 417 can be much smaller than write currents used to blow the fuses 415 and 417. Because of the smaller size of the read-access switch 430, the read-access switch 430 leaks less current from the read bit line RBL when the read-access switch 430 is turned off (e.g., when another bit cell (not shown) coupled to the read bit line is being read). Examples in which the read-access switch 430 is smaller than each of the first write-access switch 420 and the second write-access switch 424 to reduce current leakage on the read bit line RBL are discussed further below.

Figure 4B:
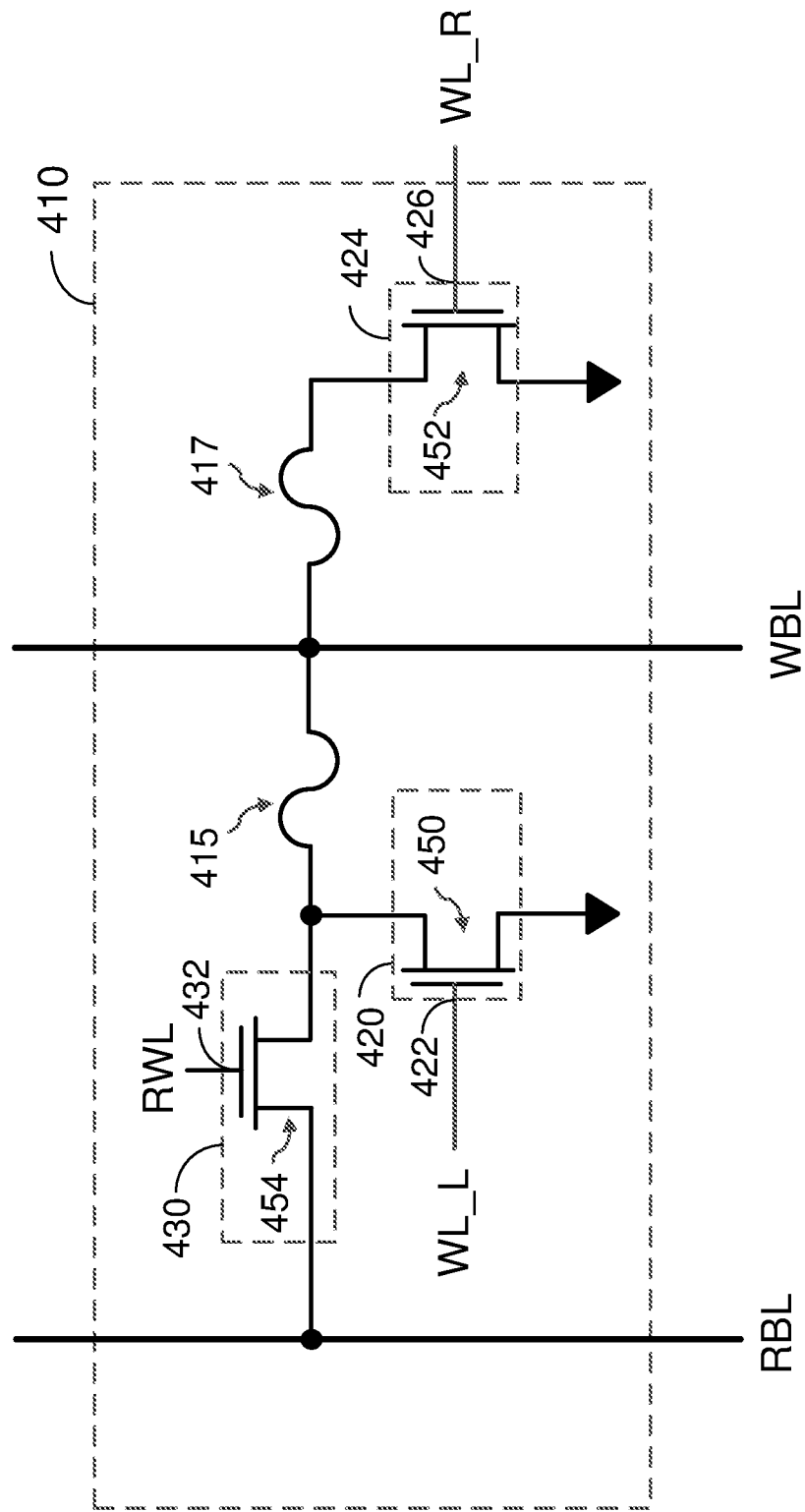
FIG. 4B shows an example in which switches in the exemplary bit cell of FIG. 4A are implemented with transistors according to certain aspects of the present disclosure.

In certain aspects, each of the switches 420, 424 and 430 is implemented with a transistor. In this regard, FIG. 4B shows an example in which each of the switches 420, 424 and 430 is implemented with a transistor (e.g., an n-type field effect transistor (NFET)) 450, 452 and 454, respectively. In this example, the control input 422, 426 and 432 of each of the switches 420, 424 and 430 is located at the gate of the respective transistor 450, 452 and 454, as shown in FIG. 4B. In this example, a switch 420, 424 and 430 may be turned on by applying a select voltage on the line coupled to the gate of the respective transistor 450, 452 and 454 where the select voltage exceeds the threshold voltage of the respective transistor 450, 454 and 454. For example, the first write-access switch 420 may be turned on (i.e., closed) by applying a select voltage on the first write-select line WL_L, the second write-access switch 424 may be turned on (i.e., closed) by applying a select voltage on the second write-select line WL_R, and the read-access switch 430 may be turned on (i.e., closed) by applying a select voltage on the read-select line RWL. The select voltages for the switches 420, 424 and 430 may be the same or different. Also, the select voltage may be the same or different for write operations and read operations.

As discussed above, the size of the read-access switch 430 may be smaller than the size of each of the first write-access switch 420 and the second write-access switch 424 to reduce leakage current on the read bit line RBL. For an example where each switch 420, 424 and 430 is implemented with a transistor (e.g., respective one of transistors 450, 452 and 454), the size of each switch 420, 424 and 430 may correspond to the width of the gate of the respective transistor. For an example where each switch 420, 424 and 430 is implemented with a transistor (e.g., respective one of transistors 450, 452 and 454) using a FinFET process, the size of each switch 420, 424 and 430 may correspond to the width and/or the height of fins in the transistor and/or the number of fins in the transistor.

In certain aspects, the size of each of the first write-access switch 420 and the second write-access switch 424 is at least twice the size of the read-access switch 430. In one example, the read-access switch 430 is 85 percent smaller than each of the first write-access switch 420 and the second write-access switch 424. For the example where each of the switches is implemented with a transistor, the transistor of each of the first write-access switch 420 and the second write-access switch 424 may have a gate width that is at least twice as wide as the gate width of the transistor of the read-access switch 430.

Figure 5:
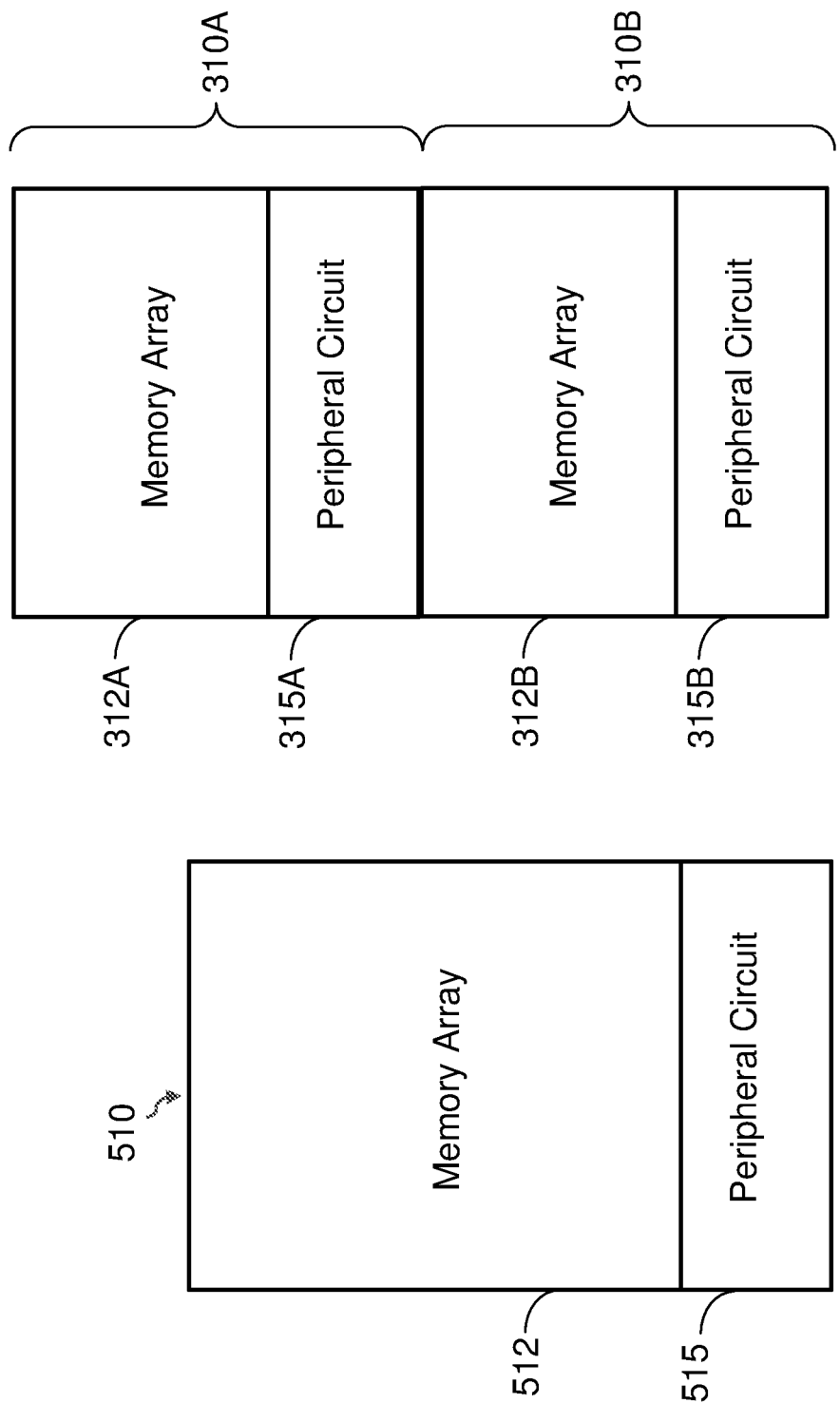
FIG. 5 shows a comparison between the area of an exemplary memory device including bit cells with redundant fuses and the combined area of two separate memory devices according to certain aspects of the present disclosure.

FIG. 5 shows an example of a memory device 510 using the bit cell 410. In this example, the memory device 510 includes a memory array 512 and a peripheral circuit 515. The memory array 512 includes multiple bit cells in which each of the bit cells may be implemented with the bit cell 410 in FIG. 4A or FIG. 4B (i.e., each of the bit cells in the memory array 512 may be a separate instance of the bit cell 410). Thus, in this example, each of the bit cells in the memory array 512 includes two respective fuses providing the bit cell with data redundancy. Note that the individual bit cells in the memory array 512 are not shown in FIG. 5 for ease of illustration. The peripheral circuit 515 is configured to write data to and read data from the bit cells in the memory array 512.

Implementing each bit cell in the memory array 512 with the bit cell 410 in FIG. 4A or FIG. 4B allows the memory device 510 to achieve data redundancy for improved read accuracy without the need for a separate redundant memory device. This allows the memory device 510 to provide data redundancy while taking up a smaller chip area compared with the approach in FIG. 3, which uses two separate memory devices 310A and 310B to achieve data redundancy.

The reduction in chip area is illustrated in FIG. 5. FIG. 5 shows an example of the chip area of the memory device 510 compared with the combined chip area of the two separate memory devices 310A and 310B in FIG. 3. Note that the memory devices 310A and 310B are shown side-by-side in FIG. 5 to illustrate the combined area of the memory devices 310A and 310B. In this example, the area of the memory device 510 is larger than the area of each of the memory devices 310A and 310B taken individually. This is because each bit cell in the memory device 510 includes two fuses for data redundancy, which increases the area of each bit cell. However, the area of the memory device 510 is smaller (e.g., 18 percent smaller) than the combined area of the two separate memory devices 310A and 310B, resulting in a net reduction in chip area compared with the approach illustrated in FIG. 3. This is due at least in part to the fact that the memory device 510 has one peripheral circuit 515 while the two separate memory devices 310A and 310 have two separate peripheral circuits 315A and 315B.

In addition, the memory device 510 consumes less power than the combined power of the memory devices 310A and 310B. This is because the memory device 510 reads data from the memory array 512 using one peripheral circuit 515 while the memory devices 310A and 310A read two copies of the data from two separate memory arrays 312A and 312B using two separate peripheral circuits 315A and 315B, which consumes more power.

Figure 6A:
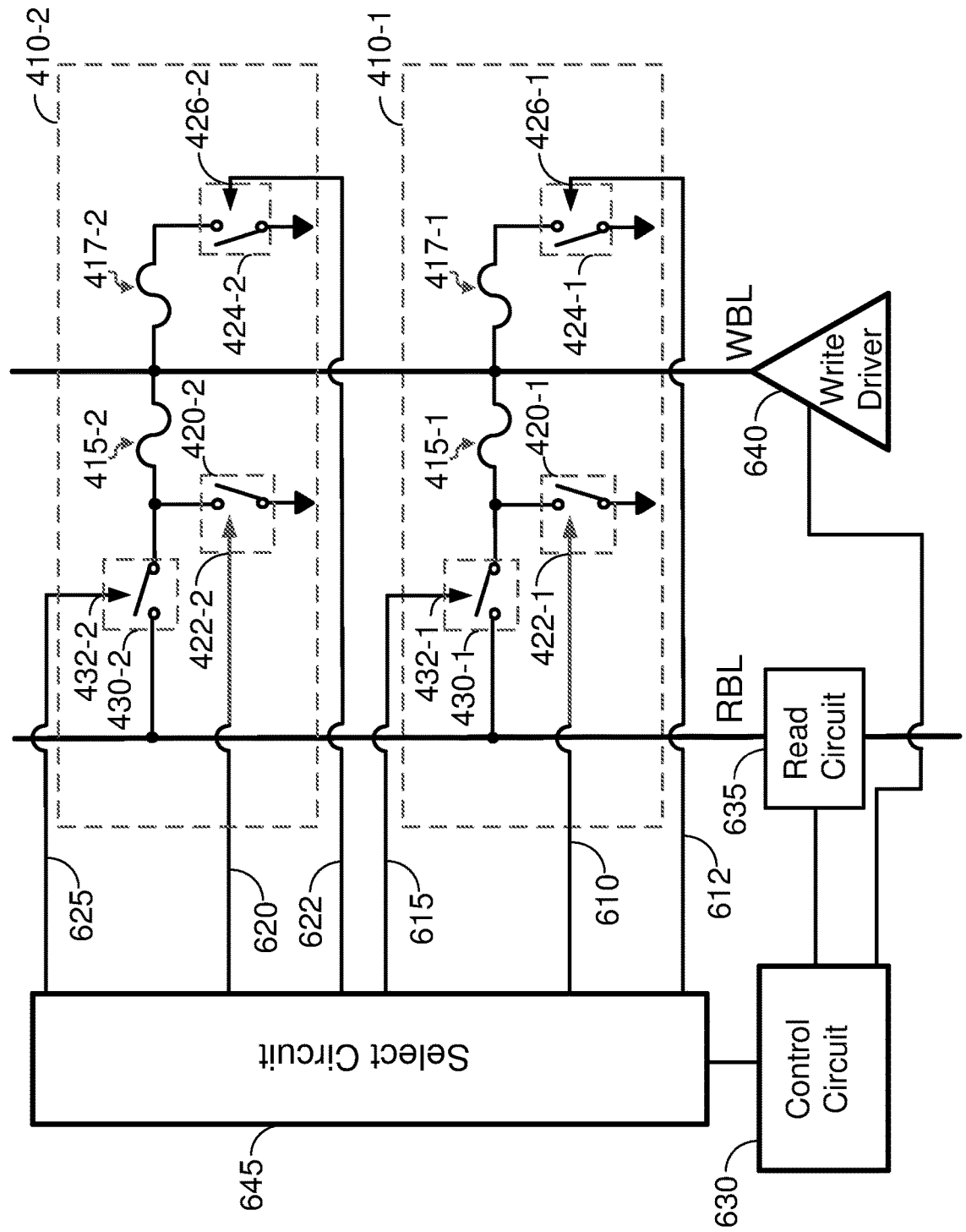
FIG. 6A shows an example of a memory device including bit cells with redundant fuses according to certain aspects of the present disclosure.

FIG. 6A shows an example of a first bit cell 410-1 and a second bit cell 410-2 in the memory array 512 of the memory device 510. In this example, each of the first bit cell 410-1 and the second bit cell 410-2 is implemented with the exemplary bit cell 410 shown in FIG. 4A (i.e., each of the first bit cell 410-1 and the second bit cell 410-2 is a separate instance of the bit cell 410). Thus, the description of the bit cell 410 given above applies to each of the first bit cell 410-1 and the second bit cell 410-2. In the example in FIG. 6, the first bit cell 410-1 and the second bit cell 410-2 are in the same column of the memory array 512. Although two bit cells are shown in FIG. 6A, it is to be appreciated that the memory array 512 may include a large number of bit cells (e.g., thousands of bit cells).

In this example, the peripheral circuit 515 of the memory device 510 includes a control circuit 630, a read circuit 635, a write driver 640, and a select circuit 645. The read circuit 635 is coupled to the read bit line RBL, and the write driver 640 is coupled to the write bit line WBL. The control circuit 630 is configured to control the read circuit 635, the write driver 640, and the select circuit 645 to perform write operations and read operations, as discussed further below. It is to be appreciated that the peripheral circuit 515 may include additional components not shown in FIG. 6A.

The first bit cell 410-1 includes a first fuse 415-1, a second fuse 417-1, a first write-access switch 420-1, a second write-access switch 424-1, and a first read-access switch 430-1. The first fuse 415-1 is coupled between the write bit line WBL and the first write-access switch 420-1, and the first write-access switch 420-1 is coupled between the first fuse 415-1 and ground. The control input 422-1 of the first write-access switch 420-1 is coupled to a first write-select line 610. The second fuse 417-1 is coupled between the write bit line WBL and the second write-access switch 424-1, and the second write-access switch 424-1 is coupled between the second fuse 417-1 and ground. The control input 426-1 of the second write-access switch 424-1 is coupled to a second write-select line 612. The first read-access switch 430-1 is coupled between the first fuse 415-1 and the read bit line RBL. The control input 432-1 of the first read-access switch 430-1 is coupled to a first read-select line 615.

The second bit cell 410-2 includes a third fuse 415-2, a fourth fuse 417-2, a third write-access switch 420-2, a fourth write-access switch 424-2, and a second read-access switch 430-2. The third fuse 415-2 is coupled between the write bit line WBL and the third write-access switch 420-2, and the third write-access switch 420-2 is coupled between the third fuse 415-2 and ground. The control input 422-2 of the third write-access switch 420-2 is coupled to a third write-select line 620. The fourth fuse 417-2 is coupled between the write bit line WBL and the fourth write-access switch 424-2, and the fourth write-access switch 424-2 is coupled between the fourth fuse 417-2 and ground. The control input 426-2 of the fourth write-access switch 424-2 is coupled to a fourth write-select line 622. The second read-access switch 430-2 is coupled between the third fuse 415-2 and the read bit line RBL. The control input 432-2 of the second read-access switch 430-2 is coupled to a second read-select line 625.

The select circuit 645 is coupled to the write-select lines 610, 612, 620 and 622 and the read-select lines 615 and 625. As discussed further below, the select circuit 645 uses the write-select lines 610, 612, 620 and 622 and the read-select lines 615 and 625 to control the on/off states of the switches in the bit cells 410-1 and 410-2 during write operations and read operations.

The fuses 415-1 to 417-1 of the first bit cell 410-1 and the fuses 415-2 and 417-2 of the second bit cell 410-2 are initially unblown. Thus, in this example, each bit cell 410-1 and 410-2 initially stores a bit value of zero. In other words, in this example, each bit cell 410-1 and 410-2 stores a bit value of zero by default.

Figure 6B:
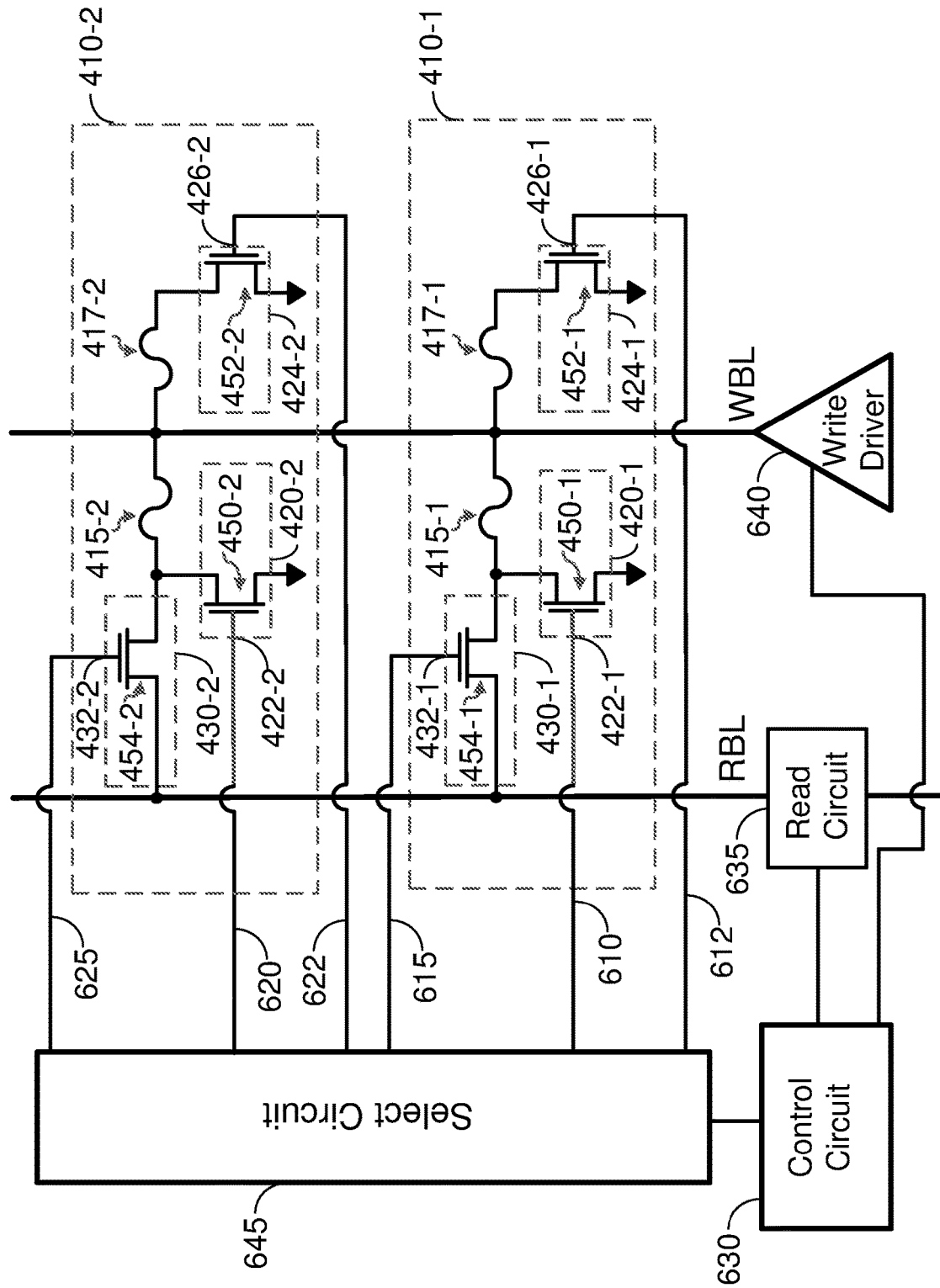
FIG. 6B shows an example in which switches in the exemplary memory device of FIG. 6A are implemented with transistors according to certain aspects of the present disclosure.

In certain aspects, the switches in the bit cells 410-1 to 410-2 may be implemented with transistors. In this regard, FIG. 6B shows an example in which each of the switches 420-1, 424-1 and 430-1 in the first bit cell 410-1 is implemented with a transistor (e.g., NFET) 450-1, 452-1 and 454-1, respectively. In this example, the control input 422-1, 426-1 and 432-1 of each of the switches 420-1, 424-1 and 430-1 is located at the gate of the respective transistor 450-1, 452-1 and 454-1, as shown in FIG. 6B.

In this example, the select circuit 645 may turn on the first write-access switch 420-1 by applying a select voltage on the first write-select line 610 exceeding the threshold voltage of the respective transistor 450-1 and turn off the first write-access switch 420-1 by applying approximately zero volts on the first write-select line 610. The select circuit 645 may turn on the second write-access switch 424-1 by applying a select voltage on the second write-select line 612 exceeding the threshold voltage of the respective transistor 452-1 and turn off the second write-access switch 424-1 by applying approximately zero volts on the second write-select line 612. The select circuit 645 may turn on the first read-access switch 430-1 by applying a select voltage on the first read-select line 615 exceeding the threshold voltage of the respective transistor 454-1 and turn off the first read-access switch 430-1 by applying approximately zero volts on the first read-select line 615.

FIG. 6B also shows an example in which each of the switches 420-2, 424-2 and 430-2 in the second bit cell 410-2 is implemented with a transistor 450-2, 452-2 and 454-2, respectively. In this example, the control input 422-2, 426-2 and 432-2 of each of the switches 420-2, 424-2 and 430-2 is located at the gate of the respective transistor 450-2, 452-2 and 454-2, as shown in FIG. 6B.

In this example, the select circuit 645 may turn on the third write-access switch 420-2 by applying a select voltage on the third write-select line 620 exceeding the threshold voltage of the respective transistor 450-2 and turn off the third write-access switch 420-2 by applying approximately zero volts on the third write-select line 620. The select circuit 645 may turn on the fourth write-access switch 424-2 by applying a select voltage on the fourth write-select line 622 exceeding the threshold voltage of the respective transistor 452-2 and turn off the fourth write-access switch 424-2 by applying approximately zero volts on the fourth write-select line 622. The select circuit 645 may turn on the second read-access switch 430-2 by applying a select voltage on the second read-select line 625 exceeding the threshold voltage of the respective transistor 454-2 and turn off the second read-access switch 430-2 by applying approximately zero volts on the second read-select line 625.

An exemplary write operation for writing (i.e., programming) a bit value of one in the first bit cell 410-1 will now be described according to certain aspects. During the write operation, the bit value of one is written into the first bit cell 410-1 by blowing both fuses 415-1 and 417-1 in the first bit cell 410-1.

In certain aspects, the first fuse 415-1 and the second fuse 417-1 are blown one at a time during the write operation. In these aspects, the control circuit 630 instructs the select circuit 645 to select the first bit cell 410-1 for writing (i.e., programming).

To blow the first fuse 415-1, the select circuit 645 turns on (i.e., closes) the first write-access switch 420-1 by selecting the first write-select line 610. The second write-access switch 424-1 and the first read-access switch 430-1 are turned off (i.e., open), in which the second write select line 612 and the first read-select lines 615 are not selected. The switches 420-2, 424-2 and 430-2 in the second bit cell 410-2 are turned off (i.e., open) since the second bit cell 410-2 in not selected for writing in this example. In this case, the third write-select line 620, the fourth write-select line 622 and the second read-select line 625 are not selected. If additional bit cells (not shown) are in the same column of the memory array 512 as the first bit cell 410-1 and the second bit cell 410-2, then the select circuit 645 also turns off the switches in these bit cells. For the example in which the switches 420-1, 420-2, 424-1, 424-2, 430-1 and 430-2 are implemented with the transistors (e.g., NFETs) 450-1, 450-2, 452-1, 452-2, 454-1 and 454-2 show in FIG. 6B, the select circuit 645 may turn on the first write-access switch 420-1 by applying a select voltage (e.g., 1.8V) on the first write-select line 610, and turn off the other switches by applying approximately zero volts on the other select lines.

Figure 7A:
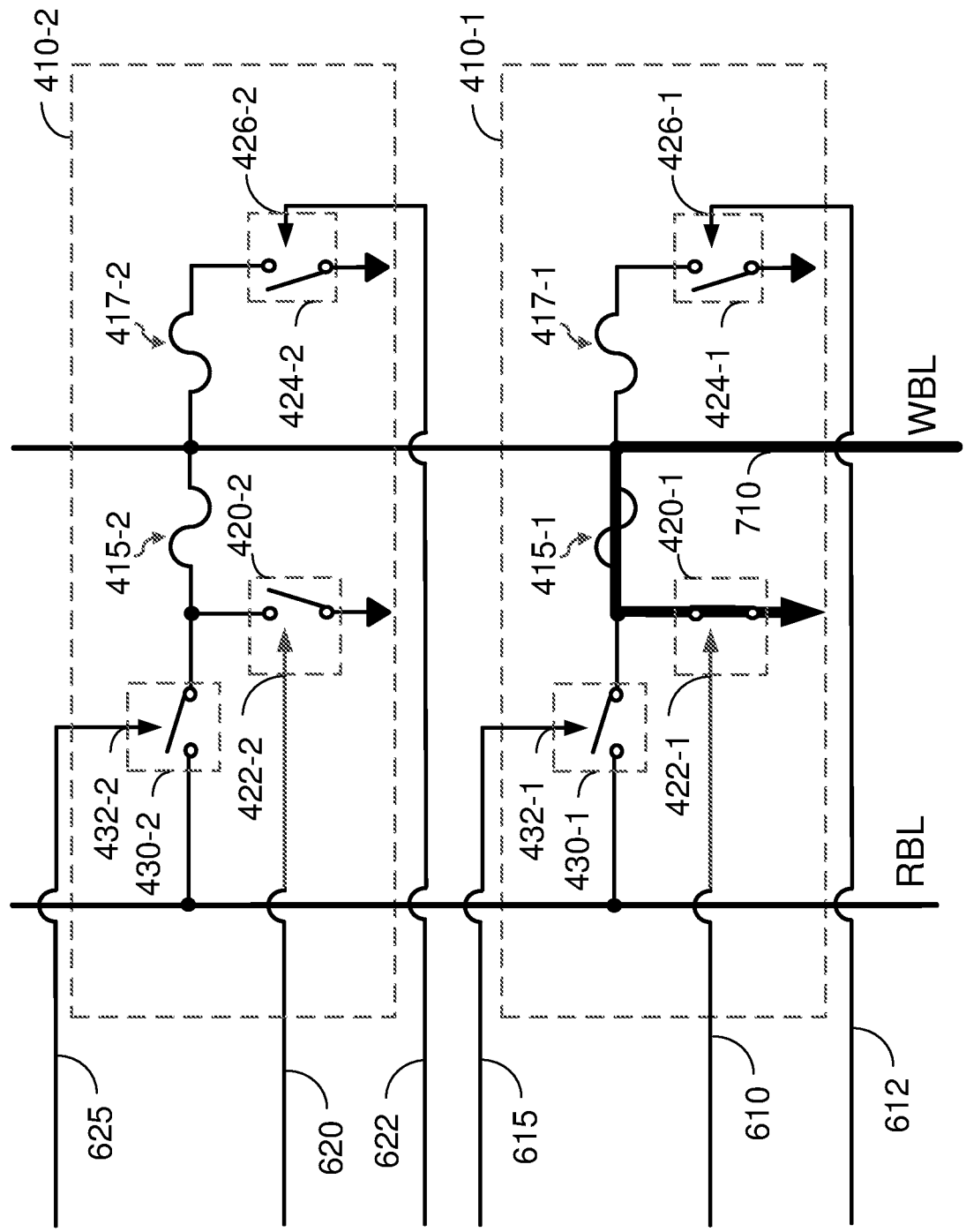
FIG. 7A shows an exemplary path of a write current for blowing a first one of two fuses in a bit cell according to certain aspects of the present disclosure.

The write driver 640 may then drive the write bit line WBL with a write voltage (e.g., 1.8 V), which causes a write current to flow through the first fuse 415-1. The write current flows through the first fuse 415-1 because the first write-access switch 420-1 (which is turned on) couples the first fuse 415-1 to ground, creating a current path to ground through the first fuse 415-1. The write current (e.g., 20 mA) blows the first fuse 415-1, causing the resistance of the first fuse 415-1 to significantly increase. FIG. 7A shows the path 710 of the write current through the first fuse 415-1 during the write operation.

After the first fuse 415-1 is blown, the select circuit 645 turns on the second write-access switch 424-1 by selecting the second write-select line 612. The first write-access switch 420-1 and the first read-access switch 430-1 are turned off (i.e., open), in which the first write select line 610 and the first read-select lines 615 are not selected. The switches 420-2, 424-2 and 430-2 in the second bit cell 410-2 are turned off (i.e., open) since the second bit cell 410-2 in not selected for writing in this example. In this case, the third write-select line 620, the fourth write-select line 622 and the second read-select line 625 are not selected. If additional bit cells (not shown) are in the same column of the memory array 512 as the first bit cell 410-1 and the second bit cell 410-2, then the select circuit 645 also turns off the switches in these bit cells. For the example in which the switches 420-1, 420-2, 424-1, 424-2, 430-1 and 430-2 are implemented with the transistors 450-1, 450-2, 452-1, 452-2, 454-1 and 454-2 show in FIG. 6B, the select circuit 645 may turn on the second write-access switch 424-1 by applying a select voltage (e.g., 1.8V) on the second write-select line 612, and turn off the other switches by applying approximately zero volts on the other select lines.

Figure 7B:
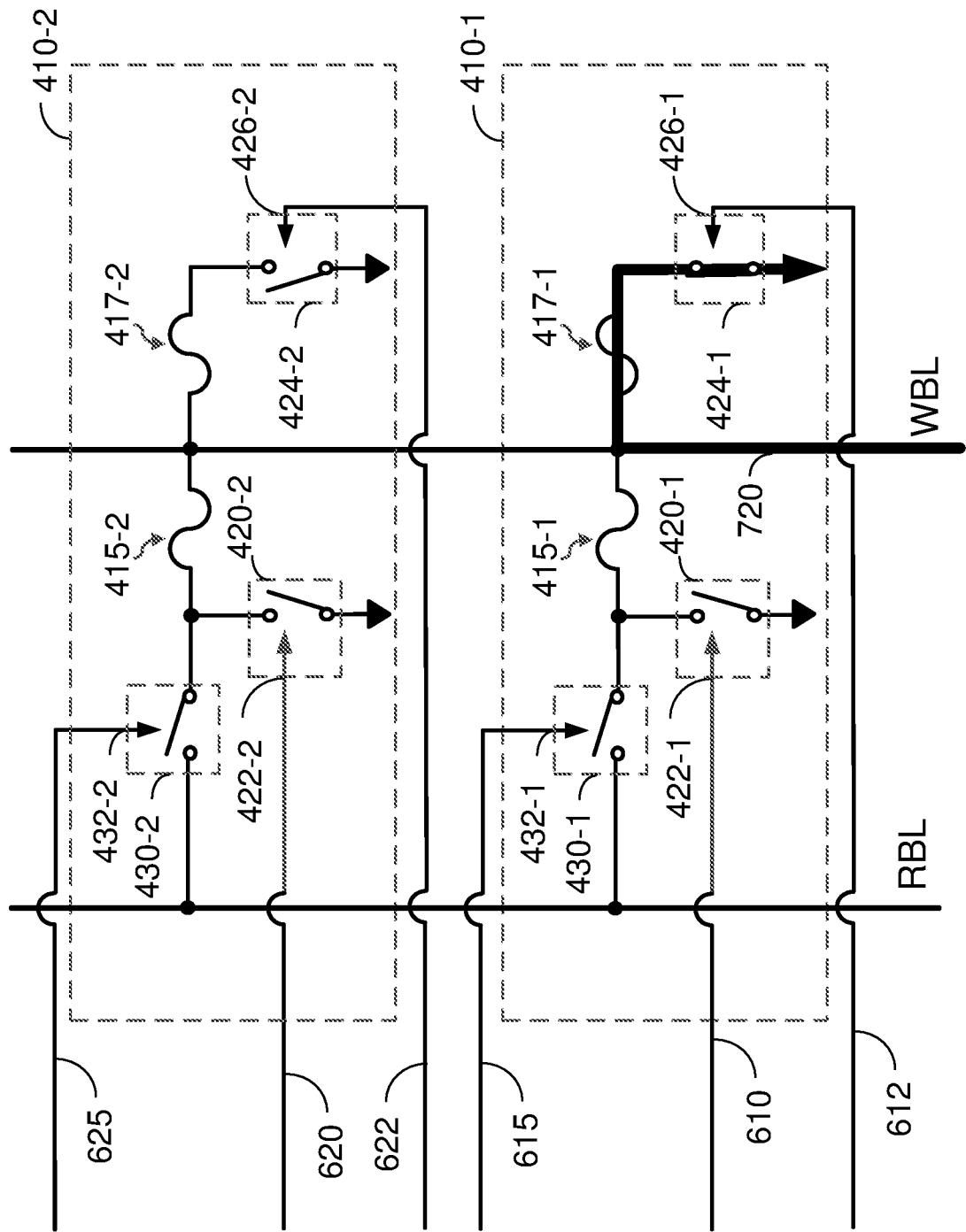
FIG. 7B shows an exemplary path of a write current for blowing a second one of the two fuses in the bit cell according to certain aspects of the present disclosure.

The write driver 640 may then drive the write bit line WBL with the write voltage (e.g., 1.8 V), which causes a write current to flow through the second fuse 417-1. The write current flows through the second fuse 417-1 because the second write-access switch 424-1 (which is turned on) couples the second fuse 417-1 to ground, creating a current path to ground through the second fuse 417-1. The write current (e.g., 20 mA) blows the second fuse 417-1. FIG. 7B shows the path 720 of the write current through the second fuse 417-1 during the write operation.

Thus, both fuses 415-1 and 417-1 are blown to store a bit value of one in the first bit cell 410-1. As discussed above, blowing both fuses 415-1 and 417-1 of the first bit cell 410-1 provides data redundancy that improves read accuracy. The second bit cell 410-2 may also be programmed with a bit value of one by repeating the above write operation with the roles of the first bit cell 410-1 and the second bit cell 410-2 reversed.

Figure 8:
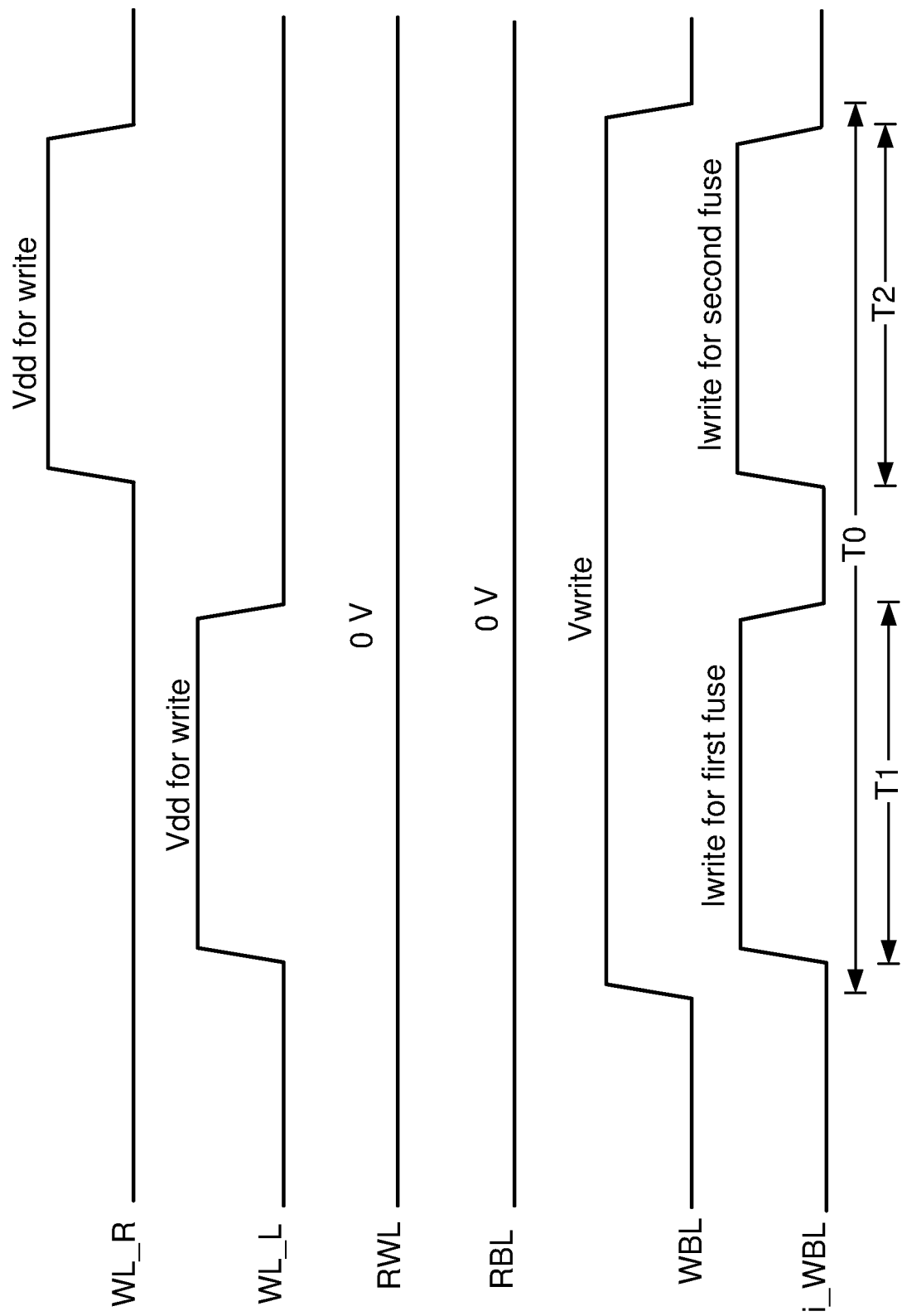
FIG. 8 shows an example of signals for programming a bit cell according to certain aspects of the present disclosure.

FIG. 8 shows exemplary waveforms during the write operation for the example in which the switches 420-1, 420-2, 424-1, 424-2, 430-1 and 430-2 are implemented with the transistors 450-1, 450-2, 452-1, 452-2, 454-1 and 454-2 shown in FIG. 6B. The waveforms in FIG. 8 include exemplary voltage waveforms for the first write-select line 610 (labeled "WL_L"), the second write-select line 612 (labeled "WL_R"), the first read-select line 615 (labeled "RWL"), the read bit line RBL, and the write bit line WBL. The waveforms in FIG. 8 also include an exemplary current waveform (labeled "i_WBL") for the write bit line WBL.

In this example, the select circuit 645 keeps the first read-select line 615 at approximately zero volts to turn off the first read-access switch 430-1. The write driver 640 applies a write voltage (labeled "Vwrite") on the write bit line WBL for a time duration of T0. The write voltage may be 1.8 V or another voltage. The select circuit 645 applies a select voltage (labeled "Vdd for write") on the first write-select line 610 for a time duration of T1 to turn on the first write-access switch 420-1. The time duration T1 is within the time duration T0. The turning on of the first write-access switch 420-1 causes a write current (labeled "Iwrite for first fuse") to flow through the write bit line WBL to blow the first fuse 415-1. After the first fuse 415-1 is blown, the select circuit 645 applies the select voltage (labeled "Vdd for write") on the second write-select line 612 for a time duration of T2 to turn on the second write-access switch 424-1. The time duration T2 is within the time duration T0 and after the time duration T1. The turning on of the second write-access switch 424-1 causes a write current (labeled "Iwrite for second fuse") to flow through the write bit line WBL to blow the second fuse 417-1.

In the above example, the first fuse 415-1 and the second fuse 417-1 are blown one at a time in which the first fuse 415-1 is blown first. However, it is to be appreciated that the present disclosure is not limited to blowing the first fuse 415-1 first. For example, the order may be reversed in which the second fuse 417-1 is blown first.

Although the first fuse 415-1 and the second fuse 417-1 are blown one at a time in the above examples, it is to be appreciated that, in other implementations, the first fuse 415-1 and the second fuse 417-1 may be blown simultaneously. For example, the select circuit 645 may turn on the first write-access switch 420-1 and the second write-access switch 424-1 simultaneously with the first read-access switch 430-1 turned off and blow the fuses 415-1 and 417-1 simultaneously. In this example, the write driver 640 may need to supply a larger write current to the write bit line WBL in order to blow both fuses 415-1 and 417-1 simultaneously.

An exemplary read operation for reading the first bit cell 410-1 will now be described according to certain aspects.

To read the first bit cell 410-1, the control circuit 630 instructs the select circuit 645 to select the first bit cell 410-1 for reading. In response, the select circuit 645 turns on the first read-access switch 430-1, turns on the second write-access switch 424-2, and turns off the first write-access switch 420-1. The select circuit 645 also turns off the switches 420-2, 424-2 and 430-2 in the second bit cell 410-2 (which is not selected for reading). If additional bit cells (not shown) are in the same column of the memory array 512 as the first bit cell 410-1 and the second bit cell 410-2, then the select circuit 645 also turns off the switches in these bit cells.

For the example in which the switches 420-1, 420-2, 424-1, 424-2, 430-1 and 430-2 are implemented with the transistors 450-1, 450-2, 452-1, 452-2, 454-1 and 454-2 show in FIG. 6B, the select circuit 645 may turn on the first read-access switch 430-1 by applying a select voltage (e.g., 1.2 V) on the first read-select line 615, turn on the second write-access switch 424-1 by applying the select voltage (e.g., 1.2 V) on the second write-select line 612, and turn off the first write-access switch 420-1 by applying approximately zero volts on the first write-select line 610.

During the read operation, the write bit line WBL is floating. For example, the control circuit 630 may float the write bit line WBL by opening a switch (not shown) between the write driver 640 and the write bit line WBL.

Figure 9:
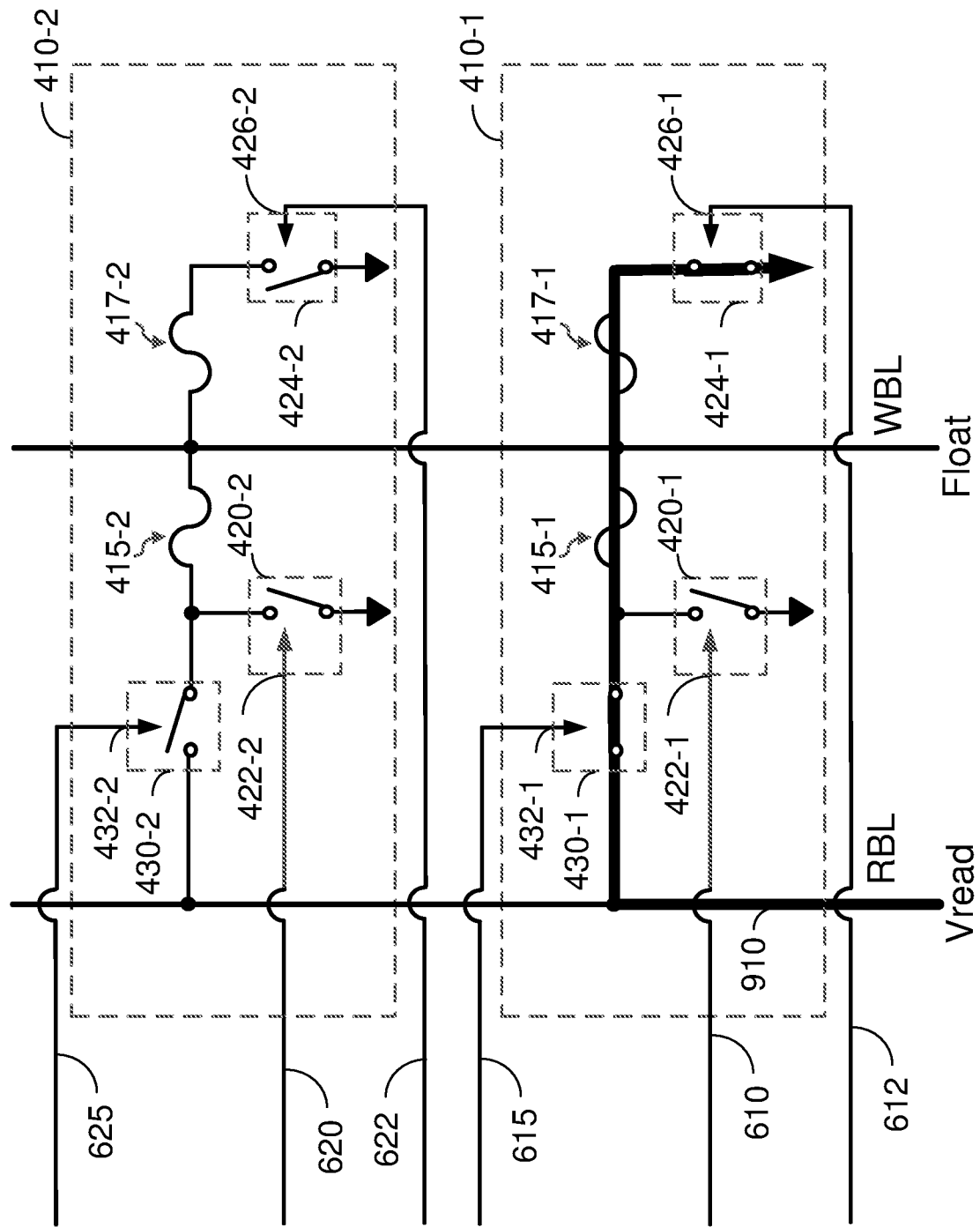
FIG. 9. shows an exemplary path of a current for reading a bit cell according to certain aspects of the present disclosure.

The read circuit 635 may then send a sense current into the read bit line RBL. The sense current flows through the first fuse 415-1 and the second fuse 417-1 of the first bit cell 410-1 in the current path 910 shown in FIG. 9. The sense current does not flow into the second bit cell 410-2 since the read-access switch 430-2 of the second bit cell 410-2 is turned off. The sense current may be much smaller than a write current used to blow a fuse.

In this example, the sense current flowing through the first fuse 415-1 and the second fuse 417-1 produces a read voltage (labeled "Vread") on the read bit line RBL that is approximately proportional to the series resistance of the first fuse 415-1 and the second fuse 417-1. The read circuit 635 senses the series resistance of the first fuse 415-1 and the second fuse 417-1 by sensing the read voltage on the read bit line RBL. The higher the series resistance of the first fuse 415-1 and the second fuse 417-1, the higher the read voltage on the read bit line RBL.

The read circuit 635 then compares the sensed read voltage with a reference voltage corresponding to the reference resistance. The sensed read voltage is above the reference voltage when the series resistance of the first fuse 415-1 and the second fuse 417-1 is above the reference resistance, and the sensed read voltage is below the reference voltage when the series resistance of the first fuse 415-1 and the second fuse 417-1 is below the reference resistance. If the sensed read voltage is above the reference voltage, then the read circuit 635 outputs a one indicating a read bit value of one. If the sensed read voltage is below the reference voltage, then the read circuit 635 outputs a zero indicating a read bit value of zero.

Figure 10:
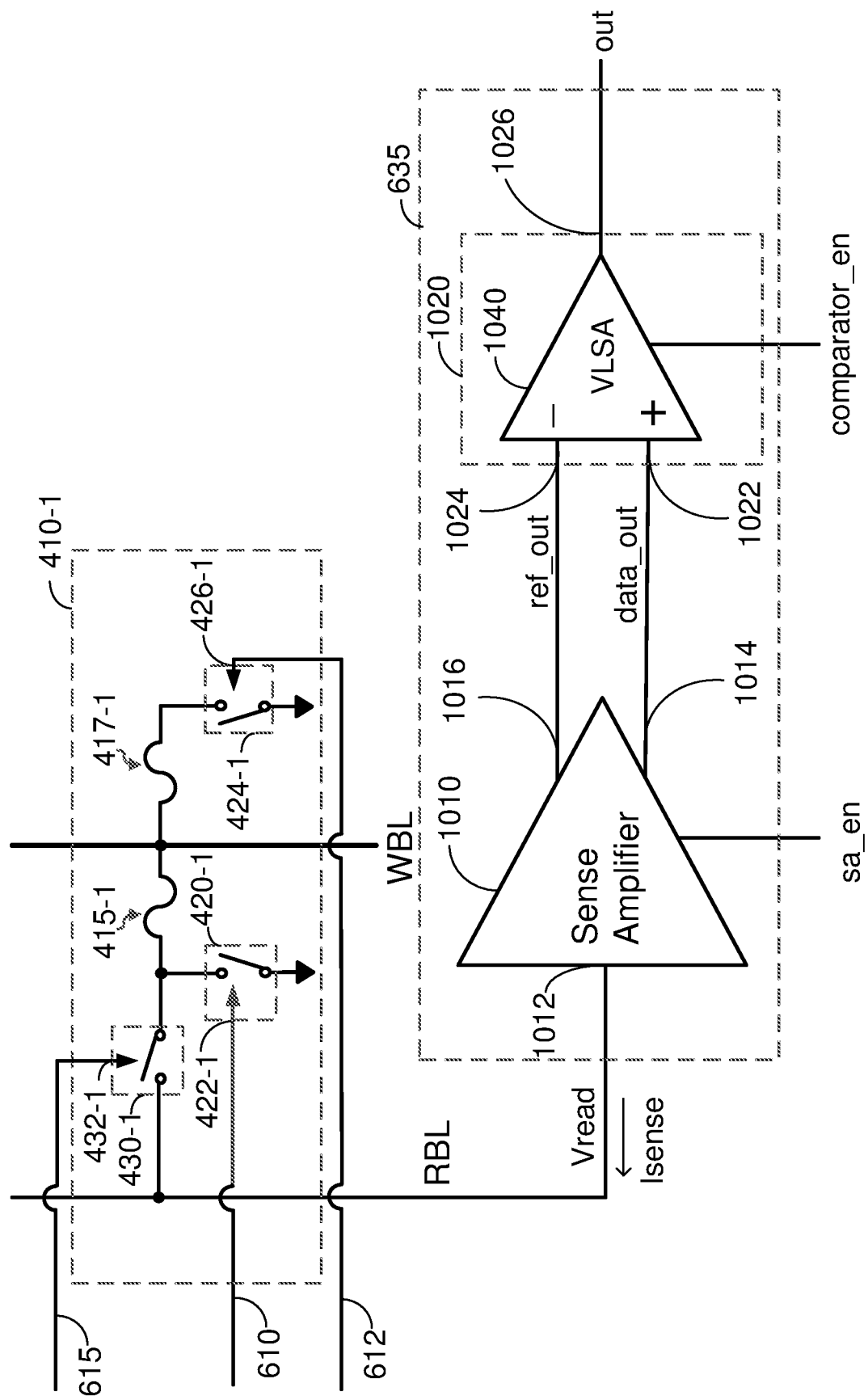
FIG. 10 shows an exemplary implementation of a read circuit according to certain aspects of the present disclosure

FIG. 10 shows an exemplary implementation of the read circuit 635 according to certain aspects. In this example, the read circuit 635 includes a sense amplifier 1010, and a comparator 1020. In certain aspects, the sense amplifier 1010 may be implemented with a current sense amplifier.

The sense amplifier 1010 has an input 1012, a first output 1014, and a second output 1016. The input 1012 is coupled to the read bit line RBL. The comparator 1020 has a first input 1022, a second input 1024, and an output 1026. The first input 1022 of the comparator 1020 is coupled to the first output 1014 of the sense amplifier 1010, and the second input 1024 of the comparator 1020 is coupled to second output 1016 of the sense amplifier 1010. The output 1026 of the comparator 1020 may be coupled to a buffer (not shown).

The comparator 1020 is selectively enable or disabled by a first enable signal (labeled "comparator_en"). When enabled, the comparator 1020 is configured to compare the voltage at the first input 1022 with the voltage at the second input 1024, and output a one or a zero at the output 1026 based on the comparison. As discussed further below, the output of the comparator 1020 provides the bit value of a read bit. In the example in FIG. 10, the comparator 1020 is implemented with a voltage-latched sense amplifier (VLSA) with the plus input of the VLSA coupled to the first input 1022 and the minus input of the VLSA coupled to the second input 1024.

The sense amplifier 1010 is selectively enabled or disabled by a second enable signal (labeled "sa_en"). When disabled, the sense amplifier 1010 is configured to pull the read bit line RBL to ground. When enabled, the sense amplifier 1010 performs operations for sensing the series resistance of a selected one of the bit cells on the read bit line RBL, as discussed further below. The first enable signal and the second enable signal may be controlled by the control circuit 630 (shown in FIG. 6A or FIG. 6B).

When the read circuit 635 is not performing a read operation, the control circuit 630 may disable the sense amplifier 1010 and the comparator 1020 using the first and second enable signals. In this case, the sense amplifier 1010 pulls the read bit line RBL to ground.

To read the bit value stored in the first bit cell 410-1, the control circuit 630 instructs the select circuit 645 to select the first bit cell 410-1 for reading. As discussed above, the select circuit 645 selects the first bit cell 410-1 for reading by turning on the first read-access switch 430-1 and the second write-access switch 424-1.

The control circuit 630 may then enable the sense amplifier 1010 and the comparator 1020 to read the bit stored in the first bit cell 410-1. When enabled, the sense amplifier 1010 drives the read bit line with a sense current (labeled "Isense") via the input 1012. The sense current flows through the first fuse 415-1 and the second fuse 417-1 of the first bit cell 410-1 in the current path 910 shown in FIG. 9. The sense current flowing through the first fuse 415-1 and the second fuse 417-1 of the first bit cell 410-1 produces a read voltage (labeled "Vread") on the read bit line RBL that is approximately proportional to the series resistance of the first fuse 415-1 and the second fuse 417-1. The sense amplifier 1010 senses the read voltage at the input 1012 of the sense amplifier 1010.

The sense amplifier 1010 amplifies the sensed read voltage to generate an output read voltage (labeled "data_out") and outputs the output read voltage at the first output 1014 of the sense amplifier 1010. The sense amplifier 1010 generates an output reference voltage (labeled "ref_out") corresponding to the reference resistance, and outputs the output reference voltage at the second output 1016. The output read voltage is above the output reference voltage when the series resistance of the first fuse 415-1 and the second fuse 417-1 in the first bit cell 410-1 is above the reference resistance, and the output read voltage is below the output reference voltage when the series resistance of the first fuse 415-1 and the second fuse 417-1 in the first bit cell 410-1 is below the reference resistance.

The comparator 1020 receives the output read voltage at the first input 1022, receives the output reference voltage at the second input 1024, and compares the output read voltage with the output reference voltage. If the output read voltage is above the output reference voltage indicating that the series resistance of the first fuse 415-1 and the second fuse 417-1 is above the reference resistance, then the comparator 1020 outputs a one indicating a read bit value of one. If the output read voltage is below the output reference voltage indicating that the series resistance of the first fuse 415-1 and the second fuse 417-1 is below the reference resistance, then the comparator 1020 outputs a one indicating a read bit value of zero.

The read circuit 635 may repeat the above operations to read other bit cells coupled to the read bit line RBL including the second bit cell 410-2.

Figure 11:
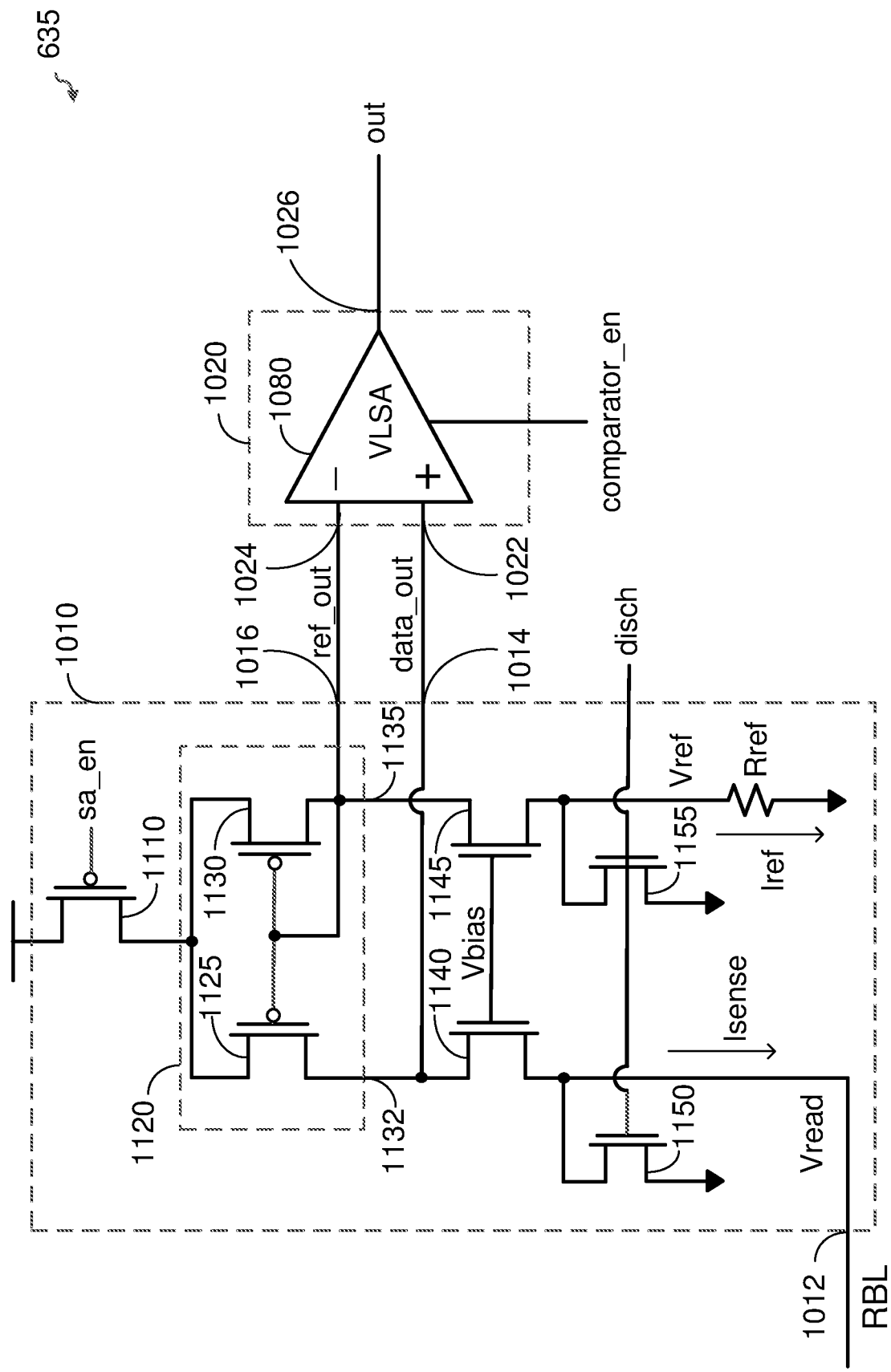
FIG. 11 shows an exemplary implementation of a sense amplifier according to certain aspects of the present disclosure.

FIG. 11 shows an exemplary implementation of the sense amplifier 1010 according to certain aspects. In this example, the sense amplifier 1010 includes an enable switch 1110, a current mirror 1120, a first transistor 1140, a second transistor 1145, a first discharge switch 1150, a second discharge switch 1155, and a reference resistor (labeled "Rref").

The enable switch 1110 is coupled between a voltage supply rail and the current mirror 1120. The enable switch 1110 is controlled by the second enable signal (labeled "sa_en") discussed above. In the example in FIG. 11, the enable switch 1110 is implemented with a p-type field effect transistor (PFET), in which the second enable signal is applied to the gate of the PFET. In this example, the enable switch 1110 turns on when the second enable signal is low and turns off when the second enable signal is high.

The current mirror 1120 has a first terminal 1132 and a second terminal 1135. When the enable switch 1110 is turned on, the current mirror 1120 is configured to mirror the current flowing through the second terminal 1135 to the first terminal 1132. In the example in FIG. 11, the current mirror 1120 includes a first current-mirror transistor 1125 and a second current-mirror transistor 1130, where each of the current-mirror transistors 1125 and 1130 is implemented with a p-type field effect transistor (PFET). The source of the first current-mirror transistor 1125 is coupled to the enable switch 1110 and the drain of the first current-mirror transistor 1125 is coupled to the first terminal 1132. The source of the second current-mirror transistor 1130 is coupled to the enable switch 1110, the gate of the second current-mirror transistor 1130 is coupled to the gate of the first current-mirror transistor 1125, and the drain of the second current-mirror transistor 1130 is coupled to the second terminal 1135. The drain of the second current-mirror transistor 1130 is also coupled to the gate of the second current-mirror transistor 1130.

The first transistor 1140 is coupled between the first terminal 1132 of the current mirror 1120 and the input 1012 of the sense amplifier 1010, which is coupled to the read bit line RBL. In the example in FIG. 11, the first transistor 1140 is an n-type field effect transistor (NFET) configured as a common gate amplifier, in which the drain of the first transistor 1140 is coupled to the first terminal 1132 of the current mirror 1120, the gate of the first transistor 1140 is biased by a bias voltage (labeled "Vbias"), and the source of the first transistor 1140 is coupled to the input 1012 of the sense amplifier 1010.

The second transistor 1145 is coupled between the second terminal 1135 of the current mirror 1120 and the reference resistor Rref. In the example in FIG. 11, the second transistor 1145 is an n-type field effect transistor (NFET) configured as a common gate amplifier, in which the drain of the second transistor 1145 is coupled to the second terminal 1135 of the current mirror 1120, the gate of the second transistor 1145 is biased by the bias voltage (labeled "Vbias"), and the source of the second transistor 1145 is coupled to the reference resistor Rref.

The reference resistor Rref is coupled between the second transistor 1145 and ground. The resistance of the reference resistor Rref provides the reference resistance discussed above. In certain aspects, the reference resistor Rref is implemented with a variable resistor having a programmable resistance to allow the reference resistance to be programmed.

The first discharge switch 1150 is coupled between the input 1012 of the sense amplifier 1010 and ground, and the second discharge switch 1155 is coupled between the reference resistor Rref and ground. In the example in FIG. 11, each of the first and second discharge switches 1150 and 1155 is implemented with an NFET and is controlled by a discharge control signal (labeled "disch") input to the gate of the NFET.

Exemplary operations of the sense amplifier 1010 will now be described according to certain aspects of the present disclosure.

When a read operation is not being performed, the control circuit 630 disables the sense amplifier 1010 using the second enable signal. The control circuit 630 also turns on the first and second discharge switches 1150 and 1155 using the discharge control signal. This causes the first discharge switch 1150 to pull the input 1012 of the sense amplifier 1010 to ground. Since the input 1012 is coupled to the read bit line RBL, the read bit line RBL is also pulled to ground. The second discharge switch 1155 pulls the voltage at the reference resistor Rref to ground.

To read the bit value stored in the first bit cell 410-1 (shown in FIG. 10), the control circuit 630 instructs the select circuit 645 to select the first bit cell 410-1 for reading. As discussed above, the select circuit 645 selects the first bit cell 410-1 for reading by selecting the first read-select line 615 and the second write-select line 612.

The control circuit 630 then turns on the enable switch 1110 using the second enable signal to enable the sense amplifier 1010. The control circuit 630 also turns off the first and second discharge switches 1150 and 1155.

The turning on of the enable switch 1110 allows a reference current (labeled "Iref") to flow through the reference resistor Rref through the enable switch 1110, the second current-mirror transistor 1130, and the second transistor 1145. The reference current flowing through the reference resistor Rref produces a reference voltage (labeled "Vref") across the reference resistor Rref, in which the reference voltage is approximately proportional to the reference resistance. The second transistor 1145 (which is configured as a common gate amplifier) amplifies the reference voltage Vref to generate the output reference voltage (labeled "ref_out") at the drain of the second transistor 1145, which is coupled to the second output 1016 of the sense amplifier 1010.

The current mirror 1120 mirrors the reference current to the first terminal 1132 of the current mirror 1120, which causes the sense current (labeled "Isense") to be approximately equal to the reference current. The sense current flows through the first current-mirror transistor 1125 and the first transistor 1140.

The sense current flows into the read bit line RBL via the input 1012. The sense current flows through the first fuse 415-1 and the second fuse 417-1 of the first bit cell 410-1 in the current path 910 shown in FIG. 9. The sense current flowing through the first fuse 415-1 and the second fuse 417-1 of the first bit cell 410-1 produces a read voltage (labeled "Vread") on the read bit line RBL that is approximately proportional to the series resistance of the first fuse 415-1 and the second fuse 417-1.

The first transistor 1140 amplifies the read voltage at the input 1012 of the sense amplifier 1010 to generate the output read voltage (labeled "data_out") at the drain of the first transistor 1140, which is coupled to the first output 1014 of the sense amplifier 1010.

In this example, the output read voltage is above the output reference voltage when the read voltage is above the reference voltage Vref. The read voltage is above the reference voltage Vref when the series resistance of the first fuse 415-1 and the second fuse 417-1 in the first bit cell 410-1 is above the resistance of the reference resistor Rref (i.e., the reference resistance). Thus, the output read voltage is above the output reference voltage when the series resistance of the first fuse 415-1 and the second fuse 417-1 in the first bit cell 410-1 is above the reference resistance, indicating a bit value of one.

The output read voltage is below the output reference voltage when the read voltage is below the reference voltage Vref. The read voltage is below the reference voltage Vref when the series resistance of the first fuse 415-1 and the second fuse 417-1 in the first bit cell 410-1 is below the resistance of the reference resistor Rref (i.e., the reference resistance). Thus, the output read voltage is below the output reference voltage when the series resistance of the first fuse 415-1 and the second fuse 417-1 in the first bit cell 410-1 is below the reference resistance, indicating a bit value of zero.

The first transistor 1140 and the second transistor 1145 also limit the read voltage at the input 1012 and the reference voltage Vref across the reference resistor Rref, respectively. This is because the maximum voltage at the source of the first transistor 1140 (which is coupled to the input 1012) is lower than the bias voltage (labeled "Vbias") minus the threshold voltage of the first transistor 1140, and the maximum voltage at the source of the second transistor 1145 (which is coupled to the reference resistor Rref) is lower than the bias voltage minus the threshold voltage of the second transistor 1145.

By limiting the read voltage at the input 1012 of the sense amplifier 1010, the first transistor 1140 limits the read voltage on the read bit line RBL. This may be done to prevent the potential on the read bit line RBL from becoming too high during a read operation, which can cause one or both fuses in a bit cell that are unblown to accidentally blow. The voltage limit on the read voltage is set by the bias voltage and the threshold voltage of the first transistor 1140.

Aspects of the present disclosure are described above using the example in which a blown fuse represents a bit value of one and an unblown fuse represents a bit value of zero. However, it is to be appreciated that the present disclosure can also be applied to the example where a blown fuse represents a bit value of zero and an unblown fuse represents a bit value of one.

Thus, in general, during a read operation of a bit cell (e.g., bit cell 410-1), the read circuit 635 reads a first bit value when the sensed series resistance of the bit cell is above the reference resistance and reads a second bit value when the sensed series resistance of the bit cell is below the reference resistance (e.g., the read circuit 635 reads the first bit value when the read voltage is above the reference voltage and reads the second bit value when the read voltage is below the reference voltage). The first bit value may be one and the second bit value may be zero, or vice versa.

Figure 12:
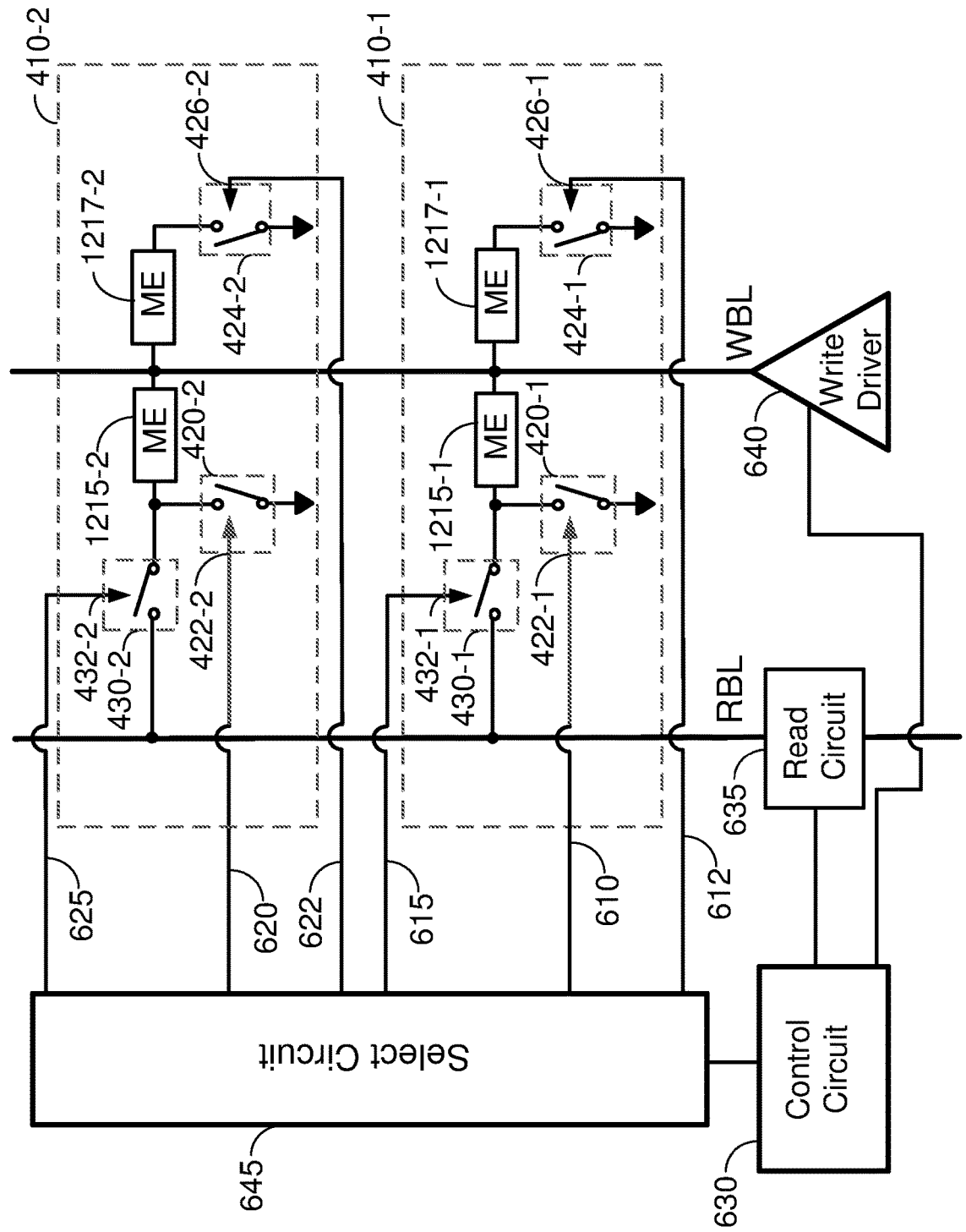
FIG. 12 shows an example of bit cells including memory elements according to certain aspects of the present disclosure.

Although aspects of the present disclosure are discussed above using the example of fuses, it is to be appreciated that the present disclosure is not limited to this example. In general, aspects of the present disclosure may be applied to other types of memory elements in which the bit value stored in a memory element is read by sensing a resistance of the memory element. In this regard, FIG. 12 shows an example in which the bit cells 410-1 and 410-2 include memory elements 1215-1, 1217-1, 1215-2 and 1217-2. Each memory element may be implemented with a fuse (e.g., a respective one of the fuses 415-1, 417-1, 415-2 and 417-2), an antifuse, a flash element, a resistive random-access memory (RRAM) element, a magnetoresistive random-access memory (MRAM) element, a phase-change random access memory (PRAM) element, or another type of memory element.

In this example, the first bit cell 410-1 includes a first memory element 1215-1, a second memory element 1217-1, the first write-access switch 420-1, the second write-access switch 424-1, and the first read-access switch 430-1. The first memory element 1215-1 is coupled between the write bit line WBL and the first write-access switch 420-1, and the first write-access switch 420-1 is coupled between the first memory element 1215-1 and ground. The control input 422-1 of the first write-access switch 420-1 is coupled to the first write-select line 610. As shown in FIG. 12, one end or terminal of the first memory element 1215-1 is coupled to the write bit line WBL and the other end or terminal of the first memory element 1215-1 is coupled to the first write-access switch 420-1.

The second memory element 1217-1 is coupled between the write bit line WBL and the second write-access switch 424-1, and the second write-access switch 424-1 is coupled between the second memory element 1217-1 and ground. The control input 426-1 of the second write-access switch 424-1 is coupled to the second write-select line 612. As shown in FIG. 12, one end or terminal of the second memory element 1217-1 is coupled to the write bit line WBL and the other end or terminal of the second memory element 1217-1 is coupled to the second write-access switch 424-1.

The first read-access switch 430-1 is coupled between the first memory element 1215-1 and the read bit line RBL. The control input 432-1 of the first read-access switch 430-1 is coupled to the first read-select line 615. The first read-access switch 430-1 may be coupled to the same end or terminal of the first memory element 1215-1 as the first write-access switch 420-1, as shown in FIG. 12.

The second bit cell 410-2 includes a third memory element 1215-2, a fourth memory element 1217-2, the third write-access switch 420-2, the fourth write-access switch 424-2, and the second read-access switch 430-2. The third memory element 1215-2 is coupled between the write bit line WBL and the third write-access switch 420-2, and the third write-access switch 420-2 is coupled between the third memory element 1215-2 and ground. The control input 422-2 of the third write-access switch 420-2 is coupled to the third write-select line 620. As shown in FIG. 12, one end or terminal of the third memory element 1217-2 is coupled to the write bit line WBL and the other end or terminal of the third memory element 1217-2 is coupled to the third write-access switch 420-2.

The fourth memory element 1217-2 is coupled between the write bit line WBL and the fourth write-access switch 424-2, and the fourth write-access switch 424-2 is coupled between the fourth memory element 1217-2 and ground. The control input 426-2 of the fourth write-access switch 424-2 is coupled to the fourth write-select line 622. As shown in FIG. 12, one end or terminal of the fourth memory element 1217-2 is coupled to the write bit line WBL and the other end or terminal of the fourth memory element 1217-2 is coupled to the fourth write-access switch 424-2.

The second read-access switch 430-2 is coupled between the third memory element 1215-2 and the read bit line RBL. The control input 432-2 of the second read-access switch 430-2 is coupled to the second read-select line 625. The second read-access switch 430-2 may be coupled to the same end or terminal of the third memory element 1215-2 as the third write-access switch 420-2, as shown in FIG. 12.

As discussed above, the memory elements 1215-1, 1217-1, 1217-2 and 1217-2 may be implemented with the fuses 415-1, 417-1, 415-2 and 417-2, respectively, or other types of memory elements in which the bit value stored in a memory element is read by sensing a resistance of the memory element. The memory elements 1215-1, 1217-1, 1217-2 and 1217-2 may be programmed using any of the exemplary writing operations discussed above or other writing operations.

To read bit cell 410-1, the control circuit 630 instructs the select circuit 645 to select the first bit cell 410-1 for reading. In response, the select circuit 645 turns on the first read-access switch 430-1, turns on the second write-access switch 424-2, and turns off the first write-access switch 420-1. During the read operation, the write bit line WBL may be floating.

The read circuit 635 may then send a sense current into the read bit line RBL.

The sense current flows through the first memory element 1215-1 and the second memory element 1217-1 of the first bit cell 410-1. The sense current does not flow into the second bit cell 410-2 since the read-access switch 430-2 of the second bit cell 410-2 is turned off.

In this example, the sense current flowing through the first memory element 1215-1 and the second memory element 1217-1 produces a read voltage on the read bit line RBL that is approximately proportional to the series resistance of the first memory element 1215-1 and the second memory element 1217-1. The read circuit 635 senses the series resistance of the first memory element 1215-1 and the second memory element 1217-1 by sensing the read voltage on the read bit line RBL.

The read circuit 635 then compares the sensed read voltage with a reference voltage corresponding to the reference resistance. In this example, the read circuit 635 may read one if the read voltage is above the reference voltage and read a zero if the read voltage is below the reference voltage, or vice versa.

Although FIGS. 6A, 6B and 12 show examples of one column of the memory array 512 for ease of discussion, it is to be appreciated the memory array 512 may include multiple columns. Each of the columns may include a respective write bit line WBL, a respective read bit line RBL, and multiple bit cells coupled to the respective write bit line WBL and read bit line RBL, in which each of the bit cells may be implemented with the exemplary bit cell 410 shown in FIG. 4A, FIG. 4B or FIG. 12 (e.g., each of the bit cells is a separate instance of the bit cell 410).

It is also to be appreciated that the peripheral circuit 515 may include multiple read circuits, in which each of the read circuits may be implemented with any one of the exemplary implementations of the read circuit 635 shown in FIGS. 10 and 11. In one example, each of the read circuits in the peripheral circuit 515 may be used to read bit cells in a respective column in the memory array 512, in which the read circuit is coupled to the read bit line RBL of the respective column. In another example, each of the read circuits in the peripheral circuit 515 may be used to read bit cells in a respective pair of columns in the memory array 512. In this example, each read circuit may be selectively coupled to one of the read bit lines of the respective pair of columns at a time using switches.

Figure 13:
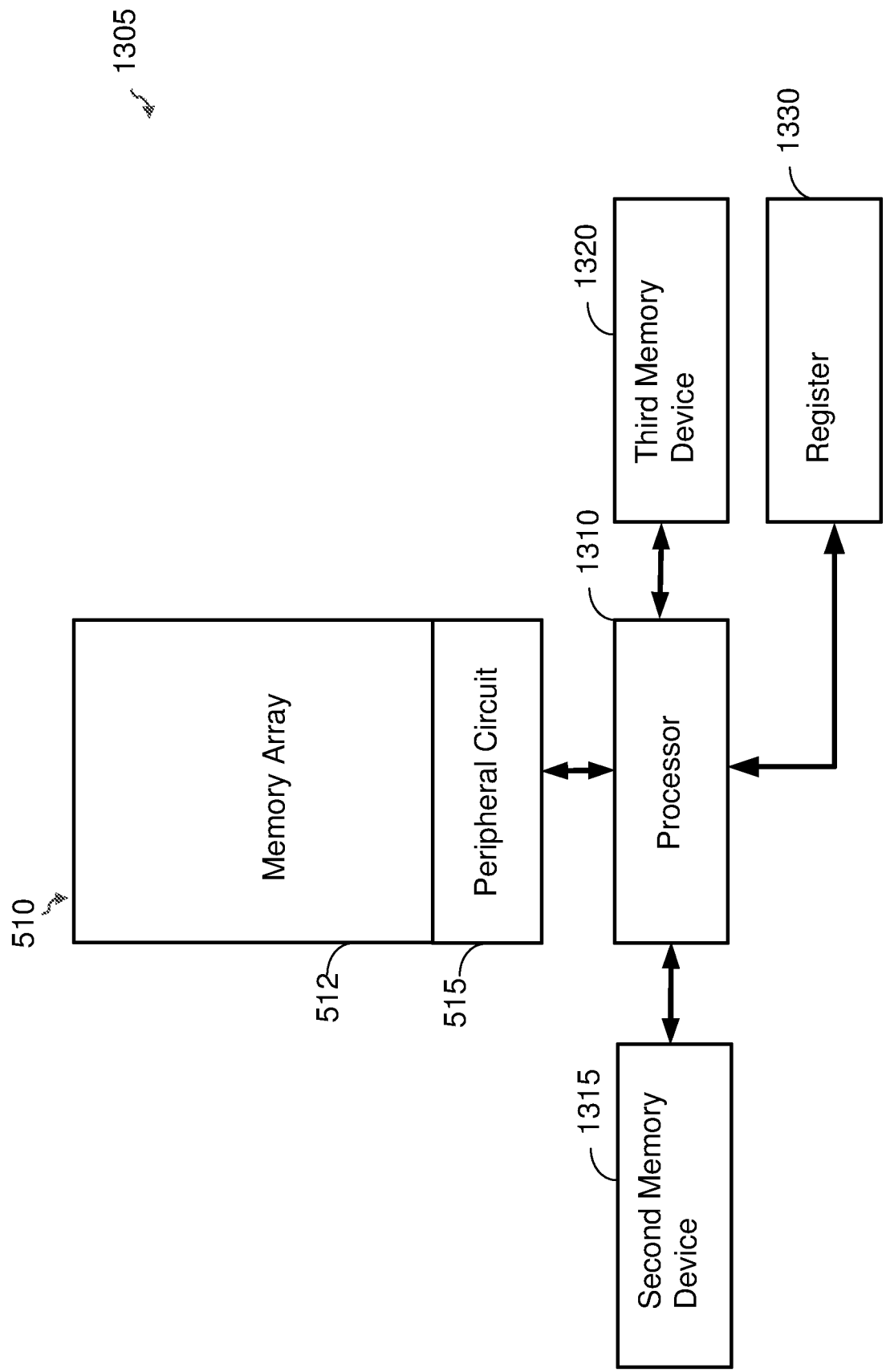
FIG. 13 shows an example of a system in which aspects of the present disclosure may be used according to certain aspects of the present disclosure.

FIG. 13 shows an example of a system 1305 in which aspects of the present disclosure may be used according to certain aspects of the present disclosure. The system 1305 may be incorporated in a mobile device (e.g., handset). In this example, the system 1305 includes the memory device 510, a processor 1310, a second memory device 1315, a third memory device 1320, and a register 1330. The second memory device 1315 may include read-only memory (ROM), flash memory, a hard drive, a solid state drive, or any combination thereof. The third memory device 1320 may include random access memory, flash memory, or another type of rewritable memory device.

The processor 1310 is coupled to the memory device 510, the second memory device 1315, the third memory device 1320, and the register 1330. With regard to the memory device 510, the processor 1310 may be coupled to one or more read circuits (e.g., read circuit 635) in the peripheral circuit 515 of the memory device 510 to read bits (e.g., security key, system settings, etc.) stored in the memory array 512 of the memory device 510.

In one example, the second memory device 1315 may store one or more bootloaders and/or other programs (also referred to as images). In this example, the processor 1310 may read a digital signature of a bootloader or other program from the second memory device 1315, read a security key stored in the memory device 510, and verify the digital signature of the bootloader or other program using the security key in an authentication process. If the digital signature is verified, then the processor 1310 may load the bootloader or other program to the third memory device 1320 and/or another memory device (not shown). In this example, the built-in data redundancy in the memory device 510 improves the integrity of the security key stored in the memory device 510 for authenticating the bootloader or other program. The bootloader may be configured to perform boot operations for the system 1305 during boot up.

In another example, the processor 1310 may read system settings from the memory device 510, and load the system settings in the register 1330. The register 1330 may be coupled to one or more devices (not shown) in the system 1305, in which the one or more devices are configured according to the system settings stored in the register 1330.

Figure 14:
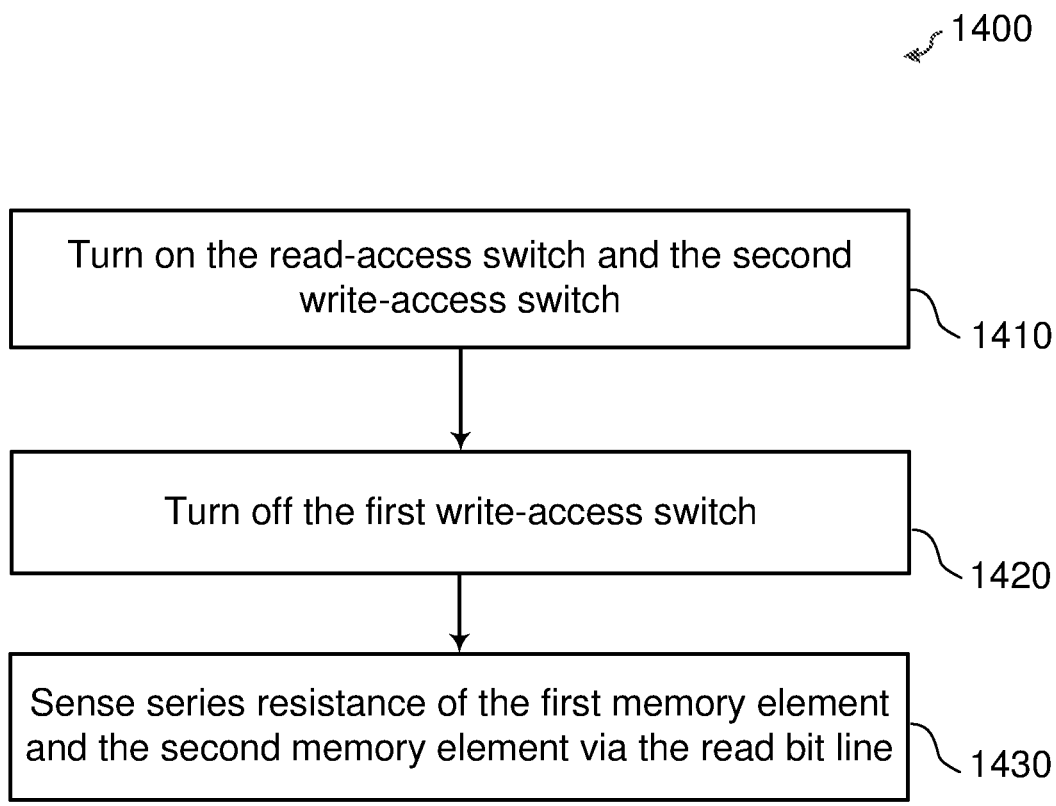
FIG. 14 is a flowchart illustrating a method of operating a bit cell according to certain aspects of the present disclosure.

FIG. 14 illustrates a method of operating a bit cell according to certain aspects of the present disclosure. The bit cell (e.g., bit cell 410-1) includes a first memory element (e.g., first memory element 1215-1) coupled to a write bit line (e.g., WBL), a first write-access switch (e.g., first write-access switch 420-1) coupled between the first memory element and a ground, a second memory element (e.g., second memory element 1217-2) coupled to the write bit line, a second write-access switch (e.g., second write-access switch 424-1) coupled between the second memory element and the ground, and a read-access switch (e.g., read-access switch 430-1) coupled between the first memory element and a read bit line.

At block 1410, the read-access switch and the second write-access switch are turned on. For example, the read-access switch and the second write-access switch may be turned on by the select circuit 645. For an example where each of the switches is implemented with a respective transistor (e.g., respective one of the transistors 452-1 and 454-1), the select circuit 645 may turn on the read-access switch by applying a select voltage (e.g., 1.2V) on a read-select line (e.g., read-select line 615) coupled to the control input of the read-access switch, and the select circuit 645 may turn on the second write-access switch by applying a select voltage (e.g., 1.2V) on a write-select line (e.g., second write-select line 612) coupled to the control input of the second write-access switch.

At block 1420, the first write-access switch is turned off. For example, the first write-access switch may be turned off by the select circuit 645. For an example where first write-access switch is implemented with a transistor (e.g., transistor 450-1), the select circuit 645 may turn off the first write-access switch by applying zero volts on a write-select line (e.g., first write-select line 610) coupled to the control input of the first write-access switch.

At block 1430, a series resistance of the first memory element and the second memory element is sensed via the read bit line. For example, the series resistance of the first memory element and the second memory element may be sensed by the read circuit 635.

In certain aspects, sensing the series resistance of the first memory element and the second memory element may include sending a sense current (e.g., Isense) to the read bit line, and sensing a read voltage (e.g., Vread) on the read bit line. The method may also include reading a first bit value (e.g., one) if the read voltage is above a reference voltage, and reading a second bit value (e.g., zero) if the voltage is below the reference voltage.

It is to be appreciated that the present disclosure is not limited to the exemplary terminology used above to describe aspects of the present disclosure. For example, an electrical fuse may also be referred to as an electronic fuse, an electrically programmable fuse, a fusible link or another term. In another example, a bit cell may also be referred to as a memory cell, or another term. In another example, a memory array may also be referred to as a memory block.

In another example, a select circuit may also be referred to as a row decoder, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

In the following, further implementations of the present disclosure are described.

Implementation 1. A bit cell, comprising:
a first memory element coupled to a write bit line;
a first write-access switch coupled between the first memory element and a ground;
a second memory element coupled to the write bit line;
a second write-access switch coupled between the second memory element and the ground; and
a read-access switch coupled between the first memory element and a read bit line, wherein a control input of the read-access switch is coupled to a read-select line.

Implementation 2. The bit cell of implementation 1, wherein the first memory element comprises a first fuse and the second memory element comprises a second fuse.

Implementation 3. The bit cell of implementation 1 or 2, wherein a size of the first write-access switch is at least twice a size of the read-access switch.

Implementation 4. The bit cell of any of implementations 1 to 3, wherein the bit cell is integrated in a memory array comprising multiple bit cells.

Implementation 5. The bit cell of any of implementations 1 to 4, wherein a control input of the first write-access switch is coupled to a first write-select line, and a control input of the second write-access switch is coupled to a second write-select line.

Implementation 6. A memory device, comprising:
a first bit cell, wherein the first bit cell comprises:
a first memory element coupled to a write bit line;
a first write-access switch coupled between the first memory element and a ground;
a second memory element coupled to the write bit line;
a second write-access switch coupled between the second memory element and the ground; and
a first read-access switch coupled between the first memory element and a read bit line, wherein a control input of the first read-access switch is coupled to a first read-select line; and
a sense amplifier coupled to the read bit line.

Implementation 7. The memory device of implementation 6, further comprising a comparator coupled to the sense amplifier.

Implementation 8. The memory device of implementation 6 or 7, wherein the comparator comprises a voltage-latched sense amplifier.

Implementation 9. The memory device of any of implementations 6 to 8, wherein the sense amplifier comprises a current sense amplifier.

Implementation 10. The memory device of any of implementations 6 to 9, further comprising a write driver coupled to the write bit line.

Implementation 11. The memory device of any of implementations 6 to 10, wherein the first memory element comprises a first fuse and the second memory element comprises a second fuse.

Implementation 12. The memory device of any of implementations 6 to 11, wherein a size of the first write-access switch is at least twice a size of the read-access switch Implementation 13. The memory device of any of implementations 6 to 12, wherein a control input of the first write-access switch is coupled to a first write-select line, and a control input of the second write access switch is coupled to a second write-select line.

Implementation 14. The memory device of implementation 13, further comprising a select circuit coupled to the first write-select line, the second write-select line, and the first read-select line.

Implementation 15. The memory device of any of implementations 6 to 14, further comprising a second bit cell, wherein the second bit cell comprises:
a third memory element coupled to the write bit line;
a third write-access switch coupled between the third memory element and the ground;
a fourth memory element coupled to the write bit line;
a fourth write-access switch coupled between the fourth memory element and the ground; and
a second read-access switch coupled between the third memory element and the read bit line, wherein a control input of the second read-access switch is coupled to a second read-select line.

Implementation 16. The memory device of implementation 15, wherein a control input of the first write-access switch is coupled to a first write-select line, a control input of the second write access switch is coupled to a second write-select line, a control input of the third write-access switch is coupled to a third write-select line, and a control input of the fourth write-access switch is coupled to a fourth write-select line.

Implementation 17. The memory device of implementation 16, further comprising a select circuit coupled to the first write-select line, the second write-select line, the third write-select line, the fourth write-select line, the first read-select line, and the second read-select line.

Implementation 18. A system, comprising:
a first memory device, wherein the first memory device comprises:
a bit cell, wherein the bit cell comprises:
a first memory element coupled to a write bit line;
a first write-access switch coupled between the first memory element and a ground;
a second memory element coupled to the write bit line;

a second write-access switch coupled between the second memory element and the ground; and a read-access switch coupled between the first memory element and a read bit line, wherein a control input of the read-access switch is coupled to a read-select line; and a read circuit coupled to the read bit line; and a processor coupled to the read circuit.

Implementation 19. The system of implementation 18, further comprising a register coupled to the processor.

Implementation 20. The system of implementation 18 or 19, further comprising a second memory device coupled to the processor.

Implementation 21. The system of implementation 20, wherein the second memory device comprises a read-only memory (ROM), a flash memory, a hard drive, or a solid state drive.

Implementation 22. The system of any of implementations 18 to 21, wherein the first memory element comprises a first fuse and the second memory element comprises a second fuse.

Implementation 23. A method of operating a bit cell, the bit cell including a first memory element coupled to a write bit line, a first write-access switch coupled between the first memory element and a ground, a second memory element coupled to the write bit line, a second write-access switch coupled between the second memory element and the ground, and a read-access switch coupled between the first memory element and a read bit line, the method comprising:

turning on the read-access switch and the second write-access switch;

turning off the first write-access switch; and sensing a series resistance of the first memory element and the second memory element via the read bit line.

Implementation 24. The method of implementation 23, further comprising:

reading a first bit value if the sensed resistance is above a reference resistance; and reading a second bit value if the sensed resistance is below the reference resistance.

Implementation 25. The method of implementation 23 or 24, wherein sensing the series resistance of the first memory element and the second memory element comprises:

sending a sense current to the read bit line; and sensing a read voltage on the read bit line.

Implementation 26. The method of implementation 25, further comprising:

reading a first bit value if the read voltage is above a reference voltage; and reading a second bit value if the voltage is below the reference voltage.

Implementation 27. The method of implementation 26, wherein the first bit value is a one, and the second bit value is a zero.

Implementation 28. The method of any of implementations 23 to 27, wherein the first memory element comprises a first fuse and the second memory element comprises a second fuse.

Implementation 29. The method of any of implementations 23 to 28, further comprising programming the first fuse, wherein programming the first fuse comprises:

turning off the read-access switch and the second write-access switch;

turning on the first write-access switch; and blowing the first fuse via the write bit line.

Implementation 30. The method of implementation 29, wherein blowing the first fuse comprises applying a write voltage on the write bit line.

Implementation 31. The method of implementation 29 or 30, further comprising programming the second fuse, wherein programming the second fuse comprises:

turning off the read-access switch and the first write-access switch;

turning on the second write-access switch; and blowing the second fuse via the write bit line.

Implementations 32. The method of any of implementations 23 to 28, further comprising programing the bit cell, wherein programming the bit cell comprises:

turning off the read-access switch;

turning on the first write-access switch and the second write-access switch; and blowing the first fuse and the second fuse via the write bit line.

Implementation 33. The method of implementation 32, wherein blowing the first fuse and the second fuse comprises applying a write voltage on the write bit line.

What is claimed is:

1. A bit cell, comprising:
a first memory element coupled to a write bit line;
a first write-access switch coupled between the first memory element and a ground;
a second memory element coupled to the write bit line;
a second write-access switch coupled between the second memory element and the ground; and
a read-access switch coupled between the first memory element and a read bit line, wherein a control input of the read-access switch is coupled to a read-select line, wherein a size of the first write-access switch is at least twice a size of the read-access switch.

2. The bit cell of claim 1, wherein the first memory element comprises a first fuse and the second memory element comprises a second fuse.

3. The bit cell of claim 1, wherein the bit cell is integrated in a memory array comprising multiple bit cells.

4. The bit cell of claim 1, wherein a control input of the first write-access switch is coupled to a first write-select line, and a control input of the second write-access switch is coupled to a second write-select line.

5. A memory device, comprising:
a first bit cell, wherein the first bit cell comprises:
a first memory element coupled to a write bit line;
a first write-access switch coupled between the first memory element and a ground;
a second memory element coupled to the write bit line;
a second write-access switch coupled between the second memory element and the ground; and
a first read-access switch coupled between the first memory element and a read bit line, wherein a control input of the first read-access switch is coupled to a first read-select line, wherein a size of the first write-access switch is at least twice a size of the read-access switch; and
a sense amplifier coupled to the read bit line.

6. The memory device of claim 5, further comprising a comparator coupled to the sense amplifier.

7. The memory device of claim 6, wherein the comparator comprises a voltage-latched sense amplifier.

8. The memory device of claim 5, wherein the sense amplifier comprises a current sense amplifier.

9. The memory device of claim 5, further comprising a write driver coupled to the write bit line.

10. The memory device of claim 5, wherein the first memory element comprises a first fuse and the second memory element comprises a second fuse.

11. The memory device of claim 5, wherein a control input of the first write-access switch is coupled to a first write-select line, and a control input of the second write access switch is coupled to a second write-select line.

12. The memory device of claim 11, further comprising a select circuit coupled to the first write-select line, the second write-select line, and the first read-select line.

13. The memory device of claim 5, further comprising a second bit cell, wherein the second bit cell comprises:
 a third memory element coupled to the write bit line;
 a third write-access switch coupled between the third memory element and the ground;
 a fourth memory element coupled to the write bit line;
 a fourth write-access switch coupled between the fourth memory element and the ground; and
 a second read-access switch coupled between the third memory element and the read bit line, wherein a control input of the second read-access switch is coupled to a second read-select line.

14. The memory device of claim 13, wherein a control input of the first write-access switch is coupled to a first write-select line, a control input of the second write access switch is coupled to a second write-select line, a control input of the third write-access switch is coupled to a third write-select line, and a control input of the fourth write-access switch is coupled to a fourth write-select line.

15. The memory device of claim 14, further comprising a select circuit coupled to the first write-select line, the second write-select line, the third write-select line, the fourth write-select line, the first read-select line, and the second read-select line.

16. A system, comprising:
 a first memory device, wherein the first memory device comprises:
  a bit cell, wherein the bit cell comprises:
   a first memory element coupled to a write bit line;
   a first write-access switch coupled between the first memory element and a ground;
   a second memory element coupled to the write bit line;
   a second write-access switch coupled between the second memory element and the ground; and
   a read-access switch coupled between the first memory element and a read bit line, wherein a control input of the read-access switch is coupled to a read-select line, wherein a size of the first write-access switch is at least twice a size of the read-access switch; and
  a read circuit coupled to the read bit line; and
 a processor coupled to the read circuit.

17. The system of claim 16, further comprising a register coupled to the processor.

18. The system of claim 16, further comprising a second memory device coupled to the processor.

19. The system of claim 18, wherein the second memory device comprises a read-only memory (ROM), a flash memory, a hard drive, or a solid state drive.

20. The system of claim 16, wherein the first memory element comprises a first fuse and the second memory element comprises a second fuse.

* * * * *